(12) United States Patent
Matsui et al.

(10) Patent No.: US 9,822,440 B2
(45) Date of Patent: Nov. 21, 2017

(54) TRANSPARENT VAPOR-DEPOSITED FILM

(71) Applicant: Dai Nippon Printing Co., Ltd., Tokyo (JP)

(72) Inventors: Shigeki Matsui, Tokyo (JP); Tatsuo Asuma, Tokyo (JP); Teruhisa Komuro, Tokyo (JP); Hiroshi Miyama, Tokyo (JP); Takakazu Goto, Tokyo (JP); Kaoru Miyazaki, Tokyo (JP); Hiroshi Matsuzaki, Tokyo (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 34 days.

(21) Appl. No.: 14/429,899

(22) PCT Filed: Sep. 26, 2013

(86) PCT No.: PCT/JP2013/076020
§ 371 (c)(1),
(2) Date: Mar. 20, 2015

(87) PCT Pub. No.: WO2014/050951
PCT Pub. Date: Apr. 3, 2014

(65) Prior Publication Data
US 2015/0275349 A1  Oct. 1, 2015

(30) Foreign Application Priority Data

Sep. 28, 2012 (JP) .................................. 2012-216418
Sep. 28, 2012 (JP) .................................. 2012-216419
(Continued)

(51) Int. Cl.
*B32B 3/10* (2006.01)
*C23C 14/08* (2006.01)
(Continued)

(52) U.S. Cl.
CPC .............. *C23C 14/081* (2013.01); *B32B 7/12* (2013.01); *C23C 14/021* (2013.01);
(Continued)

(58) Field of Classification Search
None
See application file for complete search history.

(56) References Cited

U.S. PATENT DOCUMENTS 4,981,734 A * 1/1991 Akao ..................... B32B 7/04
428/349
5,589,252 A * 12/1996 Matsuo .................. B05D 7/04
428/215
(Continued)

FOREIGN PATENT DOCUMENTS

JP  07-233463  9/1995
JP  7-233465   9/1995
(Continued)

OTHER PUBLICATIONS

Extended European Search Report dated Sep. 18, 2015 in corresponding European Application No. 13841507.0.
(Continued)

*Primary Examiner* — Christopher Polley
(74) *Attorney, Agent, or Firm* — Wenderoth, Lind & Ponack, L.L.P.

(57) ABSTRACT

Employed is a roller-type continuous vapor-deposited film forming device in which a film-forming section and a preprocessing section provided with a plasma preprocessing device are arranged in series at a distance from each other. With a substrate transported at a high speed, plasma (P) is supplied to the substrate surface side while set to an electrically positive potential by a plasma preprocessing means for supplying the plasma toward the substrate (S) in a space enclosed in a preprocessing roller, and enclosed in a plasma
(Continued)

supply means for supplying a plasma-forming gas and in a magnet (21), which is a magnetism formation means. An active preprocessed surface is formed on the surface of the substrate (S). An inorganic oxide vapor-deposited film having as a principal component thereof an aluminum oxide containing AL-C covalent bonds is immediately formed at high speed in succession on the preprocessed surface of the substrate to produce a highly adhesive transparent vapor-deposited film.

19 Claims, 2 Drawing Sheets

(30) Foreign Application Priority Data

| | | |
|---|---|---|
| Sep. 28, 2012 | (JP) | 2012-216420 |
| Sep. 28, 2012 | (JP) | 2012-216421 |
| Sep. 28, 2012 | (JP) | 2012-216422 |
| Sep. 28, 2012 | (JP) | 2012-216423 |

(51) Int. Cl.
   *C23C 14/02* (2006.01)
   *C23C 14/56* (2006.01)
   *B32B 7/12* (2006.01)

(52) U.S. Cl.
   CPC ........ *C23C 14/562* (2013.01); *B32B 2255/20* (2013.01); *B32B 2307/31* (2013.01); *B32B 2307/412* (2013.01); *B32B 2307/7242* (2013.01); *B32B 2439/00* (2013.01); *Y10T 428/24843* (2015.01); *Y10T 428/265* (2015.01); *Y10T 428/2826* (2015.01)

(56) References Cited

U.S. PATENT DOCUMENTS

| | | | | |
|---|---|---|---|---|
| 2001/0038894 | A1* | 11/2001 | Komada | B32B 7/02 428/34.6 |
| 2010/0112255 | A1 | 5/2010 | Fayet et al. | |

FOREIGN PATENT DOCUMENTS

| | | |
|---|---|---|
| JP | 2000-43182 | 2/2000 |
| JP | 2000-355071 | 12/2000 |
| JP | 2003-049261 | 2/2003 |
| JP | 2004-331210 | 11/2004 |
| JP | 2005-335109 | 12/2005 |
| JP | 2006-256091 | 9/2006 |
| JP | 2007-302283 | 11/2007 |
| JP | 2008-110798 | 5/2008 |
| JP | 2008-120427 | 5/2008 |
| JP | 4135496 | 6/2008 |
| JP | 2009-084642 | 4/2009 |
| JP | 4461737 | 2/2010 |
| JP | 2010-083776 | 4/2010 |
| JP | 2010-523362 | 7/2010 |
| JP | 2012-158348 | 8/2012 |
| JP | 2013-204123 | 10/2013 |
| WO | 2013/100073 | 7/2013 |

OTHER PUBLICATIONS

Cueff, R. et al., "Characterization and adhesion study of thin alumina coatings sputtered on PET", Thin Solid Films, vol. 270, No. 1/02, 1995, pp. 230-236.

Stoyanov, P. et al., "XPS Study of Metal/Polymer Interaction: Evaporated Aluminum on Polyvinyl Alcohol Polymer", *Surface and Interface Analysis*, vol. 15, No. 9, 1990, pp. 509-515.

International Search Report for PCT/JP2013/076020, dated Jan. 7, 2014, and English translation thereof.

Communication Pursuant to Article 94(3) EPC dated Nov. 17, 2016 in corresponding European Application No. 13841507.0.

Cueff, R. et al. "Surface Free Energy Modification of PET by Plasma Treatment—Influence on Adhesion", J. Adhesion, vol. 42, pp. 249-254 (1993).

Office Action dated Aug. 30, 2017 issuing in counterpart Japanese application No. 2014-538581.

* cited by examiner

TRANSPARENT VAPOR-DEPOSITED FILM

TECHNICAL FIELD

The present invention relates to a vapor-deposited film having a transparent property, and to a packaging material using the same.

More specifically, it relates to a transparent vapor-deposited film having transparency and high adhesiveness, and reinforced adhesiveness with plastic substrates and inorganic oxide vapor-deposited films composed mainly of aluminum oxide, which is suitable for use as a packaging material to be used for packaging in a wide range of fields including foods and retort foods, drugs and electronic parts, as well as to a packaging material using the same.

BACKGROUND ART

As wrapping materials for filling and packing of foods and beverages, chemical products, sundry goods and the like in the prior art, there have been developed substrates with gas barrier properties in a variety of forms that block or shield the passage of oxygen gas, water vapor and the like, in order to prevent alteration or discoloration of the contents.

Typical materials that have been proposed are aluminum foil or metal aluminum vapor-deposited films, that are largely unaffected by temperature or humidity, and although these exhibit highly stable gas barrier properties, when they are incinerated as waste after use, they are poorly suited for incineration and are not easy to dispose of after use, while another problem is that they have low transparency.

As a solution it has been attempted, for example, to use resin films comprising polyvinylidene chloride-based resin, ethylene-vinyl alcohol copolymer or the like, that have barrier properties that block or shield the passage of oxygen gas, water vapor and the like.

However, because polyvinylidene chloride-based resins contain chlorine in the structure, when they are incinerated as waste after use they generate harmful chlorine gas, which is undesirable from the viewpoint of environmental sanitation.

On the other hand, ethylene-vinyl alcohol copolymers have the advantage of both low oxygen permeability and low absorption of flavor components, but when contacted with water vapor their gas barrier properties are significantly reduced. It is therefore necessary at the current time to employ a complex layered structure of an ethylene-vinyl alcohol copolymer as a substrate with a barrier property, in order to block water vapor, and this tends to increase production cost.

This has led to development of substrates having a barrier property comprising a barrier layer that comprises a thin-film of an inorganic oxide such as silicon oxide or aluminum oxide, as a plastic with a gas barrier property, exhibiting a stable high gas barrier property and having transparency.

In addition, in fields that require high-temperature, high-pressure retort treatment or sterilization treatment of foods, drugs and the like, there has been a desire for substrates having a barrier property that is not affected by temperature or humidity and being able stably exhibit higher gas barrier properties, in order to prevent alteration of contents and maintain their functions and properties, and this has spurred development of substrates with barrier properties, having a multilayer structure comprising a barrier layer made of a thin-film of an inorganic oxide such as silicon oxide or aluminum oxide, and a coating film layer with a gas barrier property.

However, plastic substrates that are easily affected by temperature and humidity easily undergo dimensional change, and therefore an inorganic oxide vapor-deposited film layer such as a transparent silicon oxide thin-film layer or aluminum oxide vapor deposition layer that is formed thereover cannot easily follow the expansion and contraction that takes place with dimensional change of the plastic substrate.

Consequently, the phenomenon of interlayer separation often occurs between the plastic substrate and the inorganic oxide vapor-deposited film layer such as a transparent silicon oxide thin-film layer or silicon oxide vapor deposition layer in high temperature, high humidity environments and the like, and cracking or generation of pinholes can also occur.

As a result, the original barrier performance is significantly lost, and it is extremely difficult to retain barrier performance.

When the aforementioned vapor deposition method is used to form a transparent vapor-deposited film of an inorganic oxide, such as aluminum oxide, on a plastic substrate, the method generally employed to obtain high adhesiveness between the plastic substrate and the formed vapor-deposited film layer is inline plasma preprocessing with a parallel flat plate-type apparatus, or modification of the plastic substrate surface by formation of an undercoat treatment layer (see PTL 1 and PTL 2, for example).

However, the commonly used method of inline plasma processing method with a parallel flat plate-type apparatus described in PTL 1 introduces functional groups such as hydroxyl or carbonyl groups into the plastic surface, creating adhesiveness with the vapor-deposited film via the functional groups. However, when adhesiveness is produced by hydrogen bonding with hydroxyl groups, the adhesiveness is notably reduced in the high temperature, high humidity environments required for electronic device use, such as in the case of electronic paper, because of destruction of the hydrogen bonds.

Furthermore, since plasma processing merely passes the film under a plasma atmosphere generated in air, it is currently not possible to achieve sufficient adhesiveness between substrates and vapor-deposited films.

Furthermore, the undercoat treatment method described in PTL 2 is usually carried out by providing an undercoat layer as an adhesive layer on the plastic film surface, and this increases cost due to a greater number of steps during the production process.

A technique for improving adhesiveness is therefore employed, in which the electrode for plasma generation is situated on the substrate side and a reactive ion etching (RIE) system that generates plasma is used for preprocessing (PTL 3).

This plasma RIE method produces adhesiveness by simultaneously generating two effects, a chemical effect that includes introduction of functional groups onto the surface of the substrate, and the physical effect of ion etching of the surface causing fly-off of impurities and smoothing.

In RIE methods, unlike the aforementioned inline plasma processing, adhesiveness is not exhibited by hydrogen bonding and therefore no reduction in adhesiveness is seen in high temperature, high humidity environments.

However, since RIE methods introduce functional groups onto the plastic substrate, the resistance to cold water and hot water that can cause hydrolysis at the interface has still remained insufficient. In addition, in order to obtain sufficient adhesiveness it is necessary for the Ed value (=plasma density×processing time) to be at or above a certain value.

In RIE methods as well, it is necessary for the Ed value (=plasma density×processing time) to be at or above a certain value in order to obtain sufficient adhesiveness. An Ed value at or above a certain value using the same method can be achieved by increasing the plasma density or lengthening the processing time, but increasing the plasma density requires a high output power source, which can increase damage to the substrate, while lengthening the processing time can lower productivity (see PTL 4 and Patent Publication 5).

Furthermore, the following problems may arise, depending on the film-forming method used in combination with the preprocessing.

In vacuum vapor deposition methods, the thin-film formation speed is not slow, but the precision of thin-film homogeneity is poor, leading to poor yields.

In sputtering, despite satisfactory precision of thin-film homogeneity, the thin-film forming rate is very low and productivity is poor.

In thermal CVD processes, a source gas is oxidized and decomposed by the heat energy of the substrate to form a thin-film, and they require the substrate to be at high temperature, and when the substrate is a plastic film, decomposition and oxidation of the plastic film can occur, making it impossible to form a homogeneous thin-film on the plastic substrate.

In methods of forming a vapor-deposited film on a plastic substrate that has been subjected to preprocessing by conventional preprocessing means, problems have arisen such as insufficiency of the barrier property of the inorganic oxide vapor-deposited film formed on the plastic substrate, even if the substrate with a gas barrier property previously had resistance to moist heat, or problems such as insufficiency of adhesiveness between the vapor-deposited film and the plastic substrate.

Also, when a vapor-deposited film is formed by a film forming device combined with the aforementioned preprocessing, formation of the vapor-deposited film is accomplished in a continuous manner but without uniform formation of the vapor-deposited film, and attempts to maintain adhesiveness have resulted in a slower vapor-deposited film-forming speed and lower productivity.

In addition, when using conventional vapor-deposited films there has been limited success in obtaining sufficient resistance to moist heat while maintaining adhesiveness.

A need therefore exists for a transparent vapor-deposited film having high adhesiveness, that can solve the problems encountered with plastic substrates having vapor-deposited films with a barrier property, when an inorganic oxide vapor-deposited film is formed on the surface of a plastic substrate that is being transported as described above, and that allows production of a vapor-deposited film wherein the vapor-deposited film is reliably bonded even at high film-forming speed, while improving the adhesiveness between the plastic substrate surface and the inorganic oxide vapor-deposited film and stably exhibiting barrier performance.

In addition, there is a need for a water-resistant adhesive transparent vapor-deposited film having a vapor-deposited film with reinforced water-resistant adhesion after hot water treatment at 121° C., 60 min, on a plastic substrate having a vapor-deposited film with a barrier property, wherein the adhesiveness between the film and the inorganic oxide vapor deposition layer is not decreased after hot water treatment at 121° C., 60 min.

There is additional need for a highly adhesive transparent vapor-deposited film with resistance to moist heat, on a plastic substrate having a vapor-deposited film with a barrier property, the vapor-deposited film being such that a sufficient gas barrier property is maintained and the adhesiveness between the film and the inorganic oxide vapor deposition layer is not reduced, even after storage for 500 hours in an environment of 60° C.×90% RH (a high temperature, high humidity environment).

There is yet further need for a transparent vapor-deposited film that is suitable for retort purposes.

CITATION LIST

Patent Literature

[PTL 1] Japanese Unexamined Patent Application Publication HEI No. 7-233463
[PTL 2] Japanese Unexamined Patent Application Publication No. 2000-43182
[PTL 3] Japanese Unexamined Patent Application Publication No. 2005-335109
[PTL 4] Japanese Patent Publication No. 4461737
[PTL 5] Japanese Patent Publication No. 4135496

SUMMARY OF INVENTION

Technical Problem

The present invention has been accomplished in light of the problems mentioned above, and its object is to provide a highly adhesive transparent vapor-deposited film that has excellent homogeneity and excellent adhesiveness between the plastic substrate and the vapor-deposited film, and can exhibit barrier performance, humidity-resistant barrier performance and prolonged storage stability, without being affected by the temperature and humidity of the vapor-deposited film even when the barrier layer is formed while conveying the substrate at high speed, as well as a highly adhesive transparent vapor-deposited film that allows stable formation of a vapor-deposited film in terms of the production method, and that can improve productivity.

Solution to Problem

In order to achieve this object, the invention produces a highly adhesive transparent vapor-deposited film with reinforced adhesiveness at the interface between the plastic substrate and the inorganic oxide vapor-deposited film, by using a continuous vapor-deposited film forming device wherein a preprocessing chamber containing a specific plasma preprocessing device and a film-forming chamber are separated, for plasma processing of the plastic substrate by a plasma preprocessing device that differs from conventional RIE plasma processing, wherein the inorganic oxide vapor-deposited film that is composed mainly of aluminum oxide being formed continuously and at high speed (360 m/min-1000 m/min) on the plasma preprocessing side.

According to the invention, plasma preprocessing of a plastic substrate is carried out on the surface of a preprocessing roller under reduced pressure using a specific plasma preprocessing device, and a roller-type continuous vapor-deposited film forming device is used in a continuous manner to form an inorganic oxide vapor-deposited film on the preprocessed surface of the plastic substrate formed by the plasma processing, over a film-forming roller, to form an inorganic oxide vapor-deposited film containing Al—C covalent bonds at the lamination interface between the plastic film and the inorganic oxide vapor-deposited film that is composed mainly of aluminum oxide, and a highly adhesive transparent vapor-deposited film is obtained that has reinforced adhesiveness between the plastic substrate and the inorganic oxide vapor-deposited film.

Also, an inorganic oxide vapor-deposited film containing Al—C covalent bonds at the lamination interface between the plastic film and the inorganic oxide vapor-deposited film that is composed mainly of aluminum oxide is formed, to obtain a water-resistant adhesive transparent vapor-deposited film that has adhesiveness between the plastic substrate and the inorganic oxide vapor-deposited film even after hot water treatment, wherein the bonding strength between the plastic substrate and the vapor-deposited film is 3.0 N/15 mm or greater based on measurement of the lamination strength after hot water treatment at 121° C., 60 min.

In addition, by laminating a coating film with resistance to moist heat and a gas barrier property on the formed vapor-deposited film, to form an inorganic oxide vapor-deposited film containing Al—C covalent bonds at the lamination interface between the plastic substrate and the inorganic oxide vapor-deposited film that is composed mainly of aluminum oxide, there is obtained a highly adhesive transparent vapor-deposited film having adhesiveness between the plastic substrate and the inorganic oxide vapor-deposited film even in high temperature, high humidity environments and having a bonding strength of 3.0 N/15 mm or greater based on measurement of the lamination strength after storage for 500 hours in an environment at 60° C.×90% RH.

The highly adhesive transparent vapor-deposited film of the invention is produced in a manner that requires using a conventionally known RIE plasma processing device, or a roller-type continuous plasma preprocessing device incorporating plasma preprocessing means different from RIE processing, for plasma preprocessing, and forming a vapor-deposited film.

Furthermore, the plasma preprocessing structure has a plasma preprocessing roller that conveys a substrate, and plasma supply means and magnetism forming means facing the preprocessing roller, the plasma being formed on the substrate surface and concentrated, with a gap to entrap the plasma, wherein the supplied plasma source gas is introduced as plasma near the substrate surface, while the plastic substrate is subjected to plasma preprocessing by a roller-type plasma preprocessing device that allows plasma preprocessing while holding it with a desired voltage applied between the plasma preprocessing roller and the plasma supply means.

The invention employs a roller-type continuous vapor-deposited film forming device having a structure in which a roller-type plasma preprocessing device and a roller-type vapor-deposited film forming device that forms an inorganic oxide vapor-deposited film on the substrate surface that has been plasma processed by the preprocessing device, are provided in series, wherein low-temperature plasma is used to maintain a powerful plasma state on the plasma processing section while forming a powerful magnetic field, and the substrate surface of a plastic material or the like is treated with the plasma to form a treated surface on the plastic substrate, after which an inorganic oxide vapor-deposited film that is composed mainly of aluminum oxide is formed on the treated surface of the plastic substrate.

Furthermore, it was found that by forming an inorganic oxide vapor-deposited film that is composed mainly of aluminum oxide after the plasma preprocessing, using a continuous vapor-deposited film forming device that separately comprises a preprocessing chamber where a plasma preprocessing device of the invention is provided, and a film-forming chamber, it is possible for the highly adhesive transparent vapor-deposited film of the invention to have Al—C covalent bonds reliably formed at the interface between the plastic substrate and the inorganic oxide vapor-deposited film that is composed mainly of aluminum oxide, thereby reinforcing the adhesiveness between the vapor-deposited film and the plastic substrate by the bonded structure containing Al—C covalent bonds, and obtaining a layered transparent vapor-deposited film.

The roller-type continuous vapor-deposited film forming device that produces a highly adhesive transparent vapor-deposited film of the invention is a multiple roller-type continuous vapor-deposited film forming device comprising a pressure reduction chamber, conveying means that transports the substrate in the pressure reduction chamber, means that separates the pressure reduction chamber interior into at least a preprocessing chamber and a film-forming chamber, a preprocessing roller provided in the pressure reduction chamber for at least plasma processing of the taken-up substrate, a plurality of substrate processing rollers including a film-forming roller for film formation of a vapor-deposited film on the preprocessed surface of the substrate, plasma preprocessing means comprising plasma supply means that supplies a plasma source gas composed of oxygen, nitrogen, carbon dioxide gas or a mixture of one or more of these with argon and magnetism forming means, and vapor-deposited film-forming means for forming a vapor-deposited film on the plasma-preprocessed substrate surface.

Also, the highly adhesive transparent vapor-deposited film of the invention can be produced by using a roller-type continuous vapor-deposited film forming device, the roller-type continuous vapor-deposited film forming device having a roller-type plasma preprocessing device, with a plasma preprocessing structure having a plasma preprocessing roller and plasma supply means and magnetism forming means facing the preprocessing roller, disposed across a gap to entrap the plasma, the supplied plasma source gas being introduced as plasma near the substrate surface, and plasma being formed in a concentrated manner on the surface of the plastic substrate, thereby allowing plasma preprocessing while holding it with a voltage applied between the plasma preprocessing roller and the plasma supply means.

According to the invention, it is possible to produce a highly adhesive transparent vapor-deposited film having Al—C covalent bonds at the interface between the plastic substrate and the inorganic oxide vapor-deposited film that is composed mainly of aluminum oxide in the transparent vapor-deposited film, and with more reinforced adhesiveness between the plastic substrate and the inorganic oxide vapor-deposited film, compared to the prior art.

As a result, the invention not only reinforces the adhesiveness between the plastic substrate surface and the inorganic oxide vapor-deposited film that is composed mainly of aluminum oxide in the highly adhesive transparent vapor-deposited film, improving the gas barrier property and preventing cracking, but also helps prevent detachment even after heat treatment such as retort treatment.

In addition, the processing system allows processing at high speed (360 m/min-1000 m/min), since the preprocessing and film-forming processing can be carried out continuously in a roller-type system.

When a thin-film is to be formed to a high thickness with a single film forming device, the thin-film becomes fragile due to stress and cracking is also generated, notably lowering the gas barrier property or causing detachment of the thin-film during conveyance or during take-up, and therefore according to the invention a plurality of film forming devices may be provided to obtain a thick layer of the barrier thin-film, for multiple formation of thin-films of the same substance.

In addition, according to the invention, a plurality of film forming devices may be used to form thin-films of different materials, in which case it is possible to obtain a multilayer film imparted with not only a barrier property but also various other functions.

The plasma preprocessing device for production of a transparent vapor-deposited film according to the invention comprises plasma preprocessing means including plasma supply means and magnetism forming means, and a preprocessing roller for plasma preprocessing of the substrate surface while conveying the substrate.

For plasma preprocessing, the plasma supply means supplies a plasma source gas comprising an inert gas such as argon as a plasma source gas that does not form a coating film, and oxygen, nitrogen, carbon dioxide gas, ethylene or the like, or a mixed gas of one or more of these gas components, as an active gas component.

The plasma source gas used may be one type of inert gas alone, or a mixture with one or more active gases. Preferably, a mixed gas of an inert gas such as argon and an active gas is supplied to the plasma supply means.

The plasma supply means is set at a position opposite the plasma preprocessing roller and functions as a counter electrode, while a high-frequency voltage is applied between the counter electrode and preprocessing roller by a plasma power source to form plasma, and the plasma is supplied near the supply port of the plasma supply means with plasma being introduced into the substrate surface treatment region.

The gas supply means is mounted on the counter electrode side provided facing the preprocessing roller that conveys the substrate, and it supplies gas toward the substrate surface.

The magnetism forming means forms a magnetic field in order to create concentrated plasma on the plastic substrate surface and hold the plasma while facilitating discharge, and a magnet is set at a location opposite the preprocessing roller in the plasma preprocessing chamber. The magnetism forming means is set so as to combine the use of the counter electrode and plasma supply means with the magnet, for suitable concentration of the plasma in an efficient manner on the substrate surface.

The plasma preprocessing means of the invention is configured so that a limited and surrounded gap is formed by the counter electrode/plasma supply means composing the plasma preprocessing means, the magnetism forming means and the preprocessing roller, in order to create plasma from the supplied plasma source gas and form plasma in a concentrated manner near the plastic substrate being conveyed over the surface of the plasma preprocessing roller, the plasma being trapped within the space of the gap, forming a plasma preprocessing region at the plastic substrate surface where the plasma density is increased and also controllable.

The plasma power source applies an alternating current voltage with a frequency of from 10 Hz to 50 MHz between the counter electrode, with the plasma preprocessing roller set as the ground level, and accomplishes input power control or impedance control.

The plasma preprocessing roller set on the electrical ground level may also be set on the electrical floating level.

According to the invention, a power source is connected between the plasma preprocessing roller and the plasma supply means, forming a condition in which a desired voltage is applied between them, and a pulse voltage of 200-1000 volts as the applied voltage is applied to the power source.

By superposing a direct-current voltage with a negative voltage of minus several hundred volts with the applied pulse voltage it is possible to perform maintenance of the electrode surface in the plasma, and this improves the power efficiency while allowing efficient plasma preprocessing to be accomplished.

According to the invention, specifically, the discharge impedance is increased by widening the distance between the plasma preprocessing roller and the counter electrode/plasma supply means which are situated as a pair. As a result, with application of constant power, the discharge voltage is high and the discharge current is low, such that the plasma ion implantation effect is increased and a highly adhesive film can be formed.

Also, the flux density by the magnetism forming means is from 100 gauss to 10,000 gauss, and application of a magnetic field to the plasma traps the plasma near the surface of the plastic substrate, and when held there it has reduced loss due to exhaust and seal leakage from the partitions, allowing preprocessing to be carried out at high efficiency with the desired plasma strength.

A plasma power source is supplied to the counter electrode side in the plasma preprocessing device, but there is no limitation to this, and a plasma power source may instead be applied only to the plasma preprocessing roller, or the plasma power source may be supplied to both the plasma preprocessing roller and the counter electrode. Also, while the magnet is shown placed on the counter electrode side in the attached drawings, this is not limitative, and the magnet may instead be placed only at the plasma preprocessing roller, or the magnet may be placed at both the preprocessing roller and the counter electrode.

The highly adhesive transparent vapor-deposited film of the invention is a highly adhesive vapor-deposited film having a vapor-deposited film on a substrate, with a bonded structure at the interface between the plastic substrate and the vapor-deposited film that contains Al—C covalent bonds, wherein the vapor-deposited film has reinforced adhesiveness achieved by controlling the abundance of Al—C covalent bonds so as to be between 0.3% and 30% of the total bonds that include C, as measured by X-ray photoelectron spectroscopy (measuring conditions: X-ray source: AlKα, X-ray output: 120 W).

In addition, there is obtained a highly adhesive transparent vapor-deposited film that has much more reinforced adhesiveness than the prior art and is transparent as well as resistant to moist heat, with reinforced adhesiveness between the plastic substrate and the vapor-deposited film achieved by control so that the Al/O ratio of the inorganic oxide vapor-deposited film that is composed mainly of aluminum oxide from the interface between the film and the vapor-deposited film up to 3 nm toward the surface of the vapor-deposited film is no greater than 1.0.

The present invention has the following features.

1. A transparent vapor-deposited film having at least a laminar structure with an inorganic oxide vapor-deposited film that is composed mainly of aluminum oxide formed on the surface of a plastic substrate, the transparent vapor-deposited film containing Al—C covalent bonds at the interface between the plastic substrate and the inorganic oxide vapor-deposited film that is composed mainly of aluminum oxide.

2. A transparent vapor-deposited film according to 1. above, wherein a metal alkoxide hydrolyzable product and a water-soluble polymer mixed solution are coated onto the vapor-deposited film surface and heat-dried to produce a gas barrier coating film.

3. A transparent vapor-deposited film according to 1. or 2. above, wherein the bonding strength between the plastic substrate and the vapor-deposited film is at least 3.0 N/15 millimeters based on measurement of the lamination strength after storage for 500 hours in an environment of 60° C.×90% RH.

4. A transparent vapor-deposited film according to 1. or 2. above, wherein the bonding strength between the plastic film and the vapor-deposited film is at least 3 N/15 mm based on measurement of the lamination strength after hot water treatment at 121° C., 60 min.

5. A transparent vapor-deposited film according to any of 1. to 4. above, wherein the abundance of Al—C covalent bonds is between 0.3% and 30% of the total bonds that include C, based on measurement by X-ray photoelectron spectroscopy (measuring conditions: X-ray source: AlKα, X-ray output: 120 W), and the Al/O ratio of the inorganic oxide vapor-deposited film that is composed mainly of aluminum oxide from the interface between the plastic substrate and the vapor-deposited film up to 3 nm toward the surface of the vapor-deposited film is no greater than 1.0.

6. A transparent vapor-deposited film according to any of 1. to 5. above, wherein the vapor-deposited film containing Al—C covalent bonds is formed by holding the surface of the plastic substrate in a voltage-applied state between the plasma preprocessing roller and the plasma supply means for plasma preprocessing, and then continuously forming an inorganic oxide vapor-deposited film that is composed mainly of aluminum oxide.

7. A transparent vapor-deposited film according to 6. above, wherein the plasma preprocessing is plasma preprocessing using a roller-type continuous vapor-deposited film forming device comprising a preprocessing chamber in which the surface of a plastic substrate to be provided with a vapor-deposited film is subjected to plasma processing and a film-forming chamber in which the vapor-deposited film is formed, which are provided in a continuous manner, the plasma preprocessing having a construction in which there are situated a preprocessing roller, and plasma supply means and magnetism forming means facing the preprocessing roller, the supplied plasma source gas is introduced as plasma near the substrate surface, with a gap being formed that traps the plasma, and plasma processing is carried out while holding in a voltage-applied state between the plasma preprocessing roller and the plasma supply means.

8. A transparent vapor-deposited film according to 6. or 7. above, wherein the preprocessing by plasma is processing in which the surface of the plastic substrate on which the vapor-deposited film is to be provided is processed using a roller-type continuous vapor-deposited film forming device having a separated plasma preprocessing chamber and vapor-deposited film-forming chamber, under conditions with a plasma strength per unit area of 100-8000 W·sec/m².

9. A transparent vapor-deposited film according to any of 6. to 8. above, wherein the plasma source gas is argon alone, and/or a mixed gas with one or more from among oxygen, nitrogen and carbon dioxide gas.

10. A transparent vapor-deposited film according to 9. above, wherein the preprocessing with plasma is carried out using a plasma source gas comprising a mixed gas of argon and one or more from among oxygen, nitrogen and carbon dioxide gas.

11. A transparent vapor-deposited film according to any of 1. to 10. above, wherein the means for forming the vapor-deposited film is physical vapor deposition.

12. A transparent vapor-deposited film according to any of 1. to 11., wherein the inorganic compound is an inorganic oxide composed mainly of aluminum oxide, or a mixture thereof.

13. A transparent vapor-deposited film according to 12. above, wherein the inorganic oxide is an inorganic oxide mixture of aluminum oxide with one or more selected from among silicon oxide, magnesium oxide, tin oxide and zinc oxide.

14. A transparent vapor-deposited film according to any of 1. to 13., wherein an aluminum oxide vapor deposition layer is formed to a thickness of 5-100 nm on at least one surface of the plastic substrate.

15. A packaging material according to any of 1. to 14. above, wherein a heat-sealable thermoplastic resin is layered as an innermost layer via an adhesive layer.

16. A packaging material according to any of 2. to 14. above, wherein after forming a printed layer on the gas barrier coating film, a heat-sealable thermoplastic resin is layered as an innermost layer via an adhesive layer.

17. A packaging material according to 15. or 16., wherein the heat-sealable thermoplastic resin is a heat-sealable thermoplastic resin with a light-shielding property.

18. A packaging material according to any of 1. to 17. above, wherein the packaging material is to be used in a package for boiling or retort sterilization.

19. A packaging material according to any of 1. to 17., wherein the packaging material is to be used in a daily commodity such as a shampoo, rinse or rinse-in-shampoo, or in a cosmetic package or liquid soup package.

Advantageous Effects of Invention

The highly adhesive transparent vapor-deposited film of the invention allows formation of Al—C covalent bonds that could not be formed by conventional plasma processing, and is an inorganic oxide vapor-deposited film that is composed mainly of aluminum oxide, formed on a plastic substrate by laminar bonding that includes Al—C covalent bonds, or further having a coating film with hot water resistance and a gas barrier property on the formed vapor-deposited film, and it is therefore possible to obtain a highly adhesive transparent vapor-deposited film having vastly reinforced adhesiveness, water-resistant adhesiveness and moist heat-resistant adhesiveness between the plastic substrate and the vapor-deposited film, compared to the prior art, and excellent transparency.

The vapor-deposited film of the invention is a moist heat-resistant, transparent vapor-deposited film having a bonding strength of at least 3.0 N/15 mm between the plastic substrate and the vapor-deposited film, based on measurement of the lamination strength after storage for 500 hours in an environment of 60° C.×90% RH, vastly reinforced moist heat-resistant adhesiveness over the prior art, and also excellent transparency.

The vapor-deposited film of the invention is also a water-resistant adhesive transparent vapor-deposited film having a bonding strength of at least 3.0 N/15 mm between the plastic substrate and the vapor-deposited film, based on measurement of the lamination strength after hot water treatment at 121° C., 60 min, vastly reinforced water-resistant adhesiveness over the prior art, and also excellent transparency.

According to the invention, during formation of a layer of an inorganic oxide vapor-deposited film that is composed mainly of aluminum oxide, a voltage is applied to the surface of the plastic substrate that passes through a limited gap formed by a preprocessing roll, plasma supply means and magnetism forming means, while supplying inert argon plasma and active gas plasma with increased activity, from the plasma supply means during preprocessing. This forms plasma on the plastic substrate surface in a concentrated manner, conducting plasma processing using a specific plasma preprocessing device that can perform plasma preprocessing of the substrate surface in an effective manner at a desired plasma strength, and can accomplish plasma processing and form a vapor-deposited film on the plastic substrate in a continuous manner using a roller-type continuous vapor-deposited film forming device that comprises a plasma preprocessing device and a vapor-deposited film forming device, the device being a roll-to-roll type having a preprocessing roll and film-forming roll provided in series, thereby forming a bonded structure at the interface between the plastic substrate and the vapor-deposited film, so that Al—C covalent bonds capable of maintaining and reinforcing adhesiveness even under high temperature, high humidity environments are reliably created in the inorganic oxide vapor-deposited film.

Furthermore, the abundance of the Al—C covalent bonds can be controlled to between 0.3% and 30% of the total bonds that include C, based on measurement by X-ray photoelectron spectroscopy. In addition, the plasma ion implantation effect on the substrate can be modified to form a vapor-deposited film on the plastic substrate with reduced damage to the substrate.

As a result, the adhesiveness between the plastic substrate and vapor-deposited film is reinforced compared to the prior art and it is possible to minimize the characteristic tint of the inorganic oxide vapor-deposited film, to obtain a highly adhesive transparent vapor-deposited film having an excellent balance between vapor-deposited film bonding strength and transparency.

The present invention employs a roll-to-roll type continuous vapor-deposited film forming device comprising a specific plasma preprocessing device for formation of a vapor-deposited film, whereby a preprocessed surface is obtained to allow reliable formation of Al—C covalent bonds that reinforce adhesiveness at the interface between the plastic substrate and the inorganic oxide vapor-deposited film that is composed mainly of aluminum oxide, while an inorganic oxide vapor-deposited film is continuously formed on the preprocessed surface and a coating film with hot water resistance and a gas barrier property is continuously layered on the formed vapor-deposited film, thereby allowing formation of an adhesive vapor-deposited film containing Al—C covalent bonds at the interface between the plastic substrate and the vapor-deposited film, forming a vapor-deposited film with more reliably reinforced adhesiveness than the prior art in a high-speed and stable manner that has not been achievable by prior art processing, to allow production of a highly adhesive transparent vapor-deposited film with excellent adhesiveness, excellent productivity and resistance to moist heat.

The packaging material of the invention can exhibit satisfactory performance even when storing various contents such as water, curry or soy sauce.

DESCRIPTION OF EMBODIMENTS

A vapor-deposited film according to an embodiment of the invention, and a film forming device for formation of the vapor-deposited film, will now be described in detail with reference to the accompanying drawings. This example is merely for illustration and is not intended to limit the invention in any way.

Figure 1:
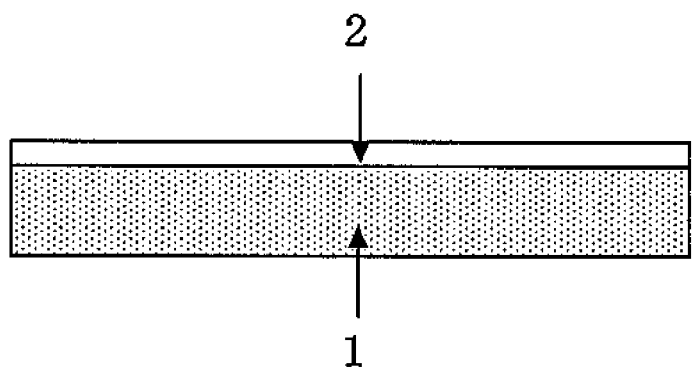
FIG. 1 is a cross-sectional view showing an example of a highly adhesive transparent vapor-deposited film of the invention.
Figure 2:
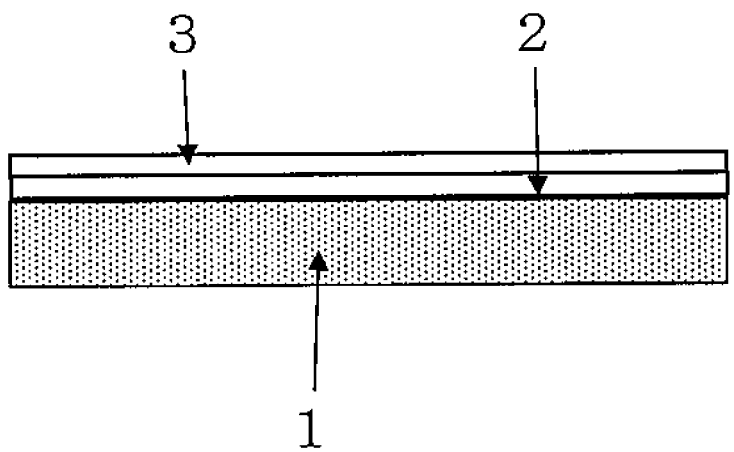
FIG. 2 is a cross-sectional view showing another example of a highly adhesive transparent vapor-deposited film of the invention.
Figure 3:
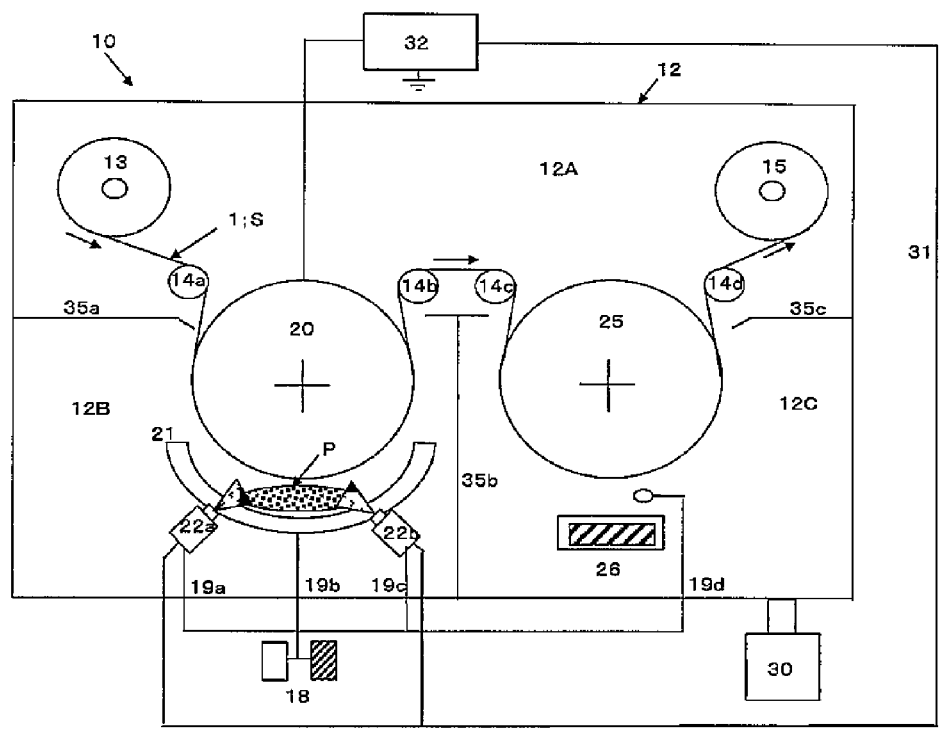
FIG. 3 is a diagram of a continuous vapor-deposited film forming device which forms a vapor-deposited film as a highly adhesive transparent vapor-deposited film of the invention.

FIG. 1 and FIG. 2 are cross-sectional views showing examples of a highly adhesive transparent vapor-deposited film as a vapor-deposited film formed according to the invention, and FIG. 3 is a diagram schematically showing the construction of a roller-type continuous vapor-deposited film forming device that forms a vapor-deposited film as a highly adhesive transparent vapor-deposited film of the invention. The gas barrier coating applicator, for formation of a highly adhesive transparent vapor-deposited film coated with a layer of a coating film with resistance to moist heat and a gas barrier property, is situated in a continuous manner with the vapor-deposited film forming device, but because it is a publicly known roller coating applicator that is provided, it is not shown here.

As shown in FIG. 1, the transparent vapor-deposited film A of the invention is a transparent vapor-deposited film having a basic laminar structure wherein, by forming an inorganic oxide vapor-deposited film that is composed mainly of aluminum oxide 2 on the surface of a plastic substrate 1 which is a biaxially stretched plastic substrate, one side of which has been subjected to plasma preprocessing using a roller-type continuous vapor-deposited film forming device utilizing plasma as shown in FIG. 3, an inorganic oxide vapor-deposited film containing Al—C covalent bonds based on measurement by X-ray photoelectron spectroscopy (hereunder abbreviated as "XPS measurement") is formed at the interface between the surface of a plastic substrate and the inorganic oxide vapor-deposited film.

The materials used in the transparent vapor-deposited film of the invention, the method for producing the highly adhesive transparent vapor-deposited film of the invention, and the apparatus used therefor, will now be described as examples of the invention.

The plastic substrate to be used in the transparent vapor-deposited film of the invention is not particularly restricted, and a publicly known plastic film or sheet may be used.

Examples of films or sheets include films or sheets of polyester-based resins such as polyethylene terephthalate (PET) and polyethylene naphthalate (PEN), polyamide-based resins such as polyamide resin 6, polyamide resin 66, polyamide resin 610, polyamide resin 612, polyamide resin 11 and polyamide resin 12, and polyolefin-based resins such as α-olefin polymers including polyethylene and polypropylene.

According to the invention, the plastic substrate film or sheet of the resin may employ one or more of these resins, and it may be produced using an extrusion method, cast molding method, T-die method, cutting method, inflation method or other film-forming method, or one or two or more different resins may be used for co-extrusion of a multilayer in the film-forming method, or two or more different resins may be used as a mixture prior to film formation, as the film-forming method.

In addition, it may be stretched in the uniaxial or biaxial direction using a tenter system or tubular system.

When one or more resins are used for film formation, various plastic mixtures or additives may also be added for the purpose of, for example, improving or modifying the workability, heat resistance, weather resistance, mechanical properties, dimensional stability, oxidation resistance, slidability, releasability, flame retardance, mold resistance, electrical properties, strength or other properties of the film, in which case they may be added as desired, from very trace amounts to several tens of percent, according to the purpose.

Examples of common additives to be used include lubricants, crosslinking agents, antioxidants, ultraviolet absorbers, light stabilizers, fillers, reinforcing agents, antistatic agents, pigments and the like, as well as modifier resins.

There are no particular restrictions on the thickness of the plastic substrate film or sheet of the invention, and it may be sufficient so as to allow preprocessing or film-forming processing during formation of the vapor-deposited film by the roller-type continuous vapor-deposited film forming device of the invention, although it is preferably 6 to 400 μm and more preferably 12 to 200 μm from the viewpoint of flexibility and form retention.

If the thickness of the substrate is within this range, it will be easily bendable and manageable with the continuous vapor-deposited film forming device of the invention, without tearing during conveyance.

An inorganic oxide vapor-deposited film layer used to compose a highly adhesive transparent vapor-deposited film according to the invention will now be described.

According to the invention, during formation of the inorganic oxide vapor-deposited film layer, the surface of the plastic substrate film or sheet must be subjected to preprocessing with the plasma processing device using plasma, as preprocessing, in order to improve adhesiveness with the inorganic oxide vapor-deposited film layer.

According to the invention, the plasma preprocessing is carried out as a method for reinforcing and improving adhesiveness between the film or sheet of different resins and the inorganic oxide vapor-deposited film, over the prior art.

As shown in FIG. 3, the roller-type continuous vapor-deposited film forming device 1 of the invention has partitions 35a-35c formed in a pressure reduction chamber 12. The partitions 35a-35c form a substrate conveying chamber 12A, a plasma preprocessing chamber 12B and a film-forming chamber 12C, and particularly they form a plasma preprocessing chamber 12B and a film-forming chamber 12C as spaces surrounded by the partitions 35a-35c, with each chamber having an exhaust chamber formed therein if necessary.

In the plasma preprocessing chamber 12B, the substrate S to be preprocessed is conveyed, with the plasma processable section of the plasma preprocessing roller 20 being exposed into the substrate conveying chamber 12A, and the substrate S is taken up while being transferred from the substrate conveying chamber 12A into the plasma preprocessing chamber 12B.

The plasma preprocessing chamber 12B and film-forming chamber 12C are provided in contact with the substrate conveying chamber 12A, so that the substrate S can be transferred without contacting air. The preprocessing chamber 12B and the substrate conveying chamber 12A are connected by a rectangular hole, a section of the plasma preprocessing roller 20 protruding outward through the rectangular hole toward the substrate conveying chamber 12A side, and a gap is opened between the walls of the conveying chamber and the preprocessing roller 20, the substrate S being transferable from the substrate conveying chamber 12A to the film-forming chamber 12C through the gap. The same structure is provided between the substrate conveying chamber 12A and the film-forming chamber 12C, allowing the substrate S to be transferred without contacting air.

The substrate conveying chamber 12A is provided with a take-up roller as take-up means for taking up into a roll form the substrate S on which the vapor-deposited film has been formed on one side and that has been transferred back into the substrate conveying chamber 12A by the film-forming roller 25, and this allows the vapor-deposited film-formed substrate S to be taken up.

In the pressure reduction chamber 12 there is provided a vacuum pump via a pressure-adjusting valve, and it can reduce the pressure throughout the entire substrate conveying chamber 12A, plasma preprocessing chamber 12B and film-forming chamber 12C that are divided by the partitions 35a-35c.

During production of the transparent vapor-deposited film of the invention, the plasma preprocessing chamber divides the plasma-generated space into another region and allows efficient evacuation of the opposing space, thereby easily controlling the plasma gas concentration and improving productivity. The preprocessing pressure resulting from pressure reduction is preferably set and maintained at about 0.1 Pa to 100 Pa.

A plasma preprocessing roller 20 is situated straddling the substrate conveying chamber 12A and the plasma preprocessing chamber 12B, and guide rolls 14a, 14b are provided between the wind-out roll 13 and the plasma preprocessing roller 20.

Also, a film-forming roller 25 is situated in the film-forming chamber 12C, and guide rolls 14c, 14d are provided between the plasma preprocessing roller 20 and the film-forming roller 25 and between the film-forming roller 25 and the take-up roller, forming a substrate film formation conveying pathway by the group of rollers.

The substrate conveying speed is not particularly restricted, but from the viewpoint of allowing high-speed film-forming processing and increasing production efficiency, it is at least 200 m/min and preferably from 480 m/min to 1000 m/min according to the invention.

In the plasma preprocessing chamber 12B there is provided a plasma preprocessing device comprising a preprocessing roller 20 for plasma preprocessing of the conveyed substrate S, and plasma preprocessing means for preprocessing of the substrate S on the preprocessing roller.

The plasma preprocessing roller 20 serves to prevent shrinkage or damage of the plastic substrate S by heat during plasma processing by the plasma preprocessing means, and to apply the plasma P to the substrate S in a uniform manner across a wide region.

The preprocessing roller 20 is preferably adjustable to a constant temperature between −20° C. and 100° C. by adjusting the temperature of the temperature-adjusting medium circulating in the preprocessing roller. Electrical insulators are provided on both sides of the center section of the roller main body and around the rotating shaft, and the substrate S is taken up at the center section of the roller main body.

The preprocessing roller 20 is installed at an electrical ground level. In this case, a metal conducting material can be used for the roller main body, rotating shaft, bearing or roller support.

Also, the preprocessing roller 20 may be set at an electrical floating level, i.e. an insulating potential. If the potential of the preprocessing roller 20 is at a floating level, it will be possible to prevent leakage of electric power, the input power for plasma preprocessing can be increased, and utilization efficiency for preprocessing will be high.

The plasma preprocessing means comprises plasma supply means and magnetism forming means. The plasma preprocessing means cooperates with the plasma preprocessing roller 20 to enclose the plasma P near the surface of the substrate S, and by changing the shape of the surface of the substrate, the chemical bonded state and functional groups, it is possible to alter the chemical properties and increase adhesiveness between the substrate and the vapor deposited film formed on the substrate during film formation in subsequent steps.

The plasma preprocessing means is provided covering a portion of the preprocessing roller 20. Specifically, the plasma supply means and magnetism forming means composing the plasma preprocessing means are placed along the surface near the outer periphery of the preprocessing roller 20, and are placed so that a sandwiched gap is formed by the plasma supply means having a preprocessing roller 20 and plasma supply nozzles 22a, 22b that supply plasma source gas and comprise electrodes that generate plasma P, and the magnetism forming means having a magnet 21 to promote generation of plasma P.

Thus, the plasma supply nozzles 22a, 22b open into the space of the gap to create a plasma-forming region and form regions with high plasma density near the surface of the preprocessing roller 20 and plastic substrate S, thereby forming a plasma processing surface on one side of the substrate.

The plasma supply means of the plasma preprocessing means comprises a starting material volatilizing and supply apparatus 18 connected to a plasma supply nozzle provided on the exterior of the pressure reduction chamber 12, and source gas-supply nozzles 19a-19d that supply a source gas from the apparatus. The supplied plasma source gas is an inert gas alone such as argon, or a mixed gas with oxygen, nitrogen, carbon dioxide gas or one or more of these gases, supplied from a gas reservoir at a gas flow rate measured by a flow rate controller.

The supplied gases are mixed in a prescribed proportion as necessary, to form a plasma source gas alone or a mixed gas for plasma formation, and supplied to the plasma supply means. The single or mixed gas is supplied to the plasma supply nozzles 22a, 22b of the plasma supply means, the supply ports of the plasma supply nozzles 22a, 22b being supplied near the outer periphery of the preprocessing roller 20 where the supply port is open.

The nozzle opening is directed toward the substrate S on the preprocessing roller 20 allowing plasma P to be uniformly diffused and supplied on the plastic substrate surface, so that homogeneous plasma preprocessing can be accomplished on a large-area section of the substrate.

The plasma supply nozzles 22a, 22b are designed to have electrode functions, functioning as counter electrodes against the ground electrode of the preprocessing roller 20, and by the potential difference produced by high-frequency voltage or the like supplied between them and the preprocessing roller 20, the supplied plasma source gas is brought to an excited state and plasma P is generated and supplied.

The plasma preprocessing device must have a mechanism for producing a desired direct current potential between the plasma preprocessing roller and the plasma preprocessing means, to strengthen or weaken the implantation effect of the plasma P on the substrate S. In order to strengthen the plasma implantation effect, it is preferred to impart a negative potential to the substrate S, and in order to weaken the plasma implantation effect it is preferred to impart a positive potential to the substrate S.

By performing such adjustment of the plasma strength, the plasma implantation effect into the substrate S can be adjusted, damage to the plastic substrate S can be reduced, and conversely the adhesion rate of film onto the plastic substrate S can be reinforced.

Specifically, the plasma supply means of the plasma preprocessing means is provided with a power source 32 that can apply a desired voltage to the plasma preprocessing roller 20, and that can apply a bias voltage for conversion to a positive potential of the plasma P that is capable of physical or chemical modification of properties of the surface of the substrate.

Such plasma supply means is capable of supplying the plasma P near the outer periphery of the preprocessing roller 20 to the desired density, and it can increase the power efficiency of the plasma preprocessing.

The plasma strength per unit area used for the invention is between 100 and 8000 W·sec/m$^2$, there being no effect of plasma preprocessing at 50 W·sec/m$^2$ or lower, while at 4000 W·sec/m$^2$ or higher the substrate will tend to undergo degradation by plasma, such as ablation, breakage, coloration or burning.

The plasma preprocessing means also has magnetism forming means. The magnetism forming means has an insulating spacer and base plate provided in a magnet case, with a magnet 21 in the base plate. An insulating shield plate is provided in the magnet case, with an electrode being attached to the insulating shield plate.

Therefore, even when the magnet case and electrode are electrically insulated and the magnet case is placed and anchored in the pressure reduction chamber 12, the electrode can be at an electrical floating level.

Power supply wiring 31 is connected to the electrode, the power supply wiring 31 also being connected to the power source 32. A temperature-adjusting medium tube is also provided inside the electrode to cool the electrode and magnet 21.

The magnet 21 is provided to concentrate and apply the plasma P from the plasma supply nozzles 22a, 22b serving as electrode/plasma supply means, on the substrate S. By providing the magnet 21, it is possible to increase reactivity near the substrate surface and to rapidly form a satisfactory plasma preprocessing surface.

The magnet 21 has a flux density of between 10 gauss and 10,000 gauss at the location of the surface of the substrate S. If the flux density at the substrate surface is at least 10 gauss it will be possible to adequately increase the reactivity near the substrate surface, and to rapidly form a satisfactory preprocessed surface.

According to the invention, the configuration and shape of the electrode magnet 21 is such that, since the ions and electrons formed during plasma preprocessing move according to the configuration and shape, the electrons, ions or substrate decomposition product evenly diffuse across the entire electrode surface even when plasma preprocessing is carried out on a plastic substrate with a large area of 1 m$^2$ or greater, to allow homogeneous and stable preprocessing at the desired plasma strength, even when the plastic substrate S has a large area.

The plastic substrate S, having a plasma processed surface formed on one side by the plasma preprocessing roller 20, then moves from the substrate conveying chamber 12A to the film-forming chamber 12C by guide rolls 14a-14d that guide it to the film-forming chamber 12C, and an inorganic oxide vapor-deposited film is formed in the film-forming chamber.

(Vapor-Deposited Film-Forming Method)

The inorganic oxide vapor-deposited film layer of the invention is a thin-film having gas barrier performance that blocks or shields permeation of oxygen gas, water vapor and the like, and it may be produced, for example, by a method of forming an aluminum oxide layer using a chemical vapor deposition method.

The inorganic oxide layer used to form the vapor-deposited film is an inorganic oxide layer composed primarily of aluminum oxide, and it is a layer composed mainly of an aluminum compound, containing at least aluminum oxide or its nitride or carbide, either alone or as a mixture.

In addition, the inorganic oxide vapor-deposited film layer may be a layer composed of a mixture of inorganic oxides, containing the aluminum compound as the major component, and containing Al—C covalent bonds, and also comprising a metal oxide such as silicon oxide, silicon nitride, silicon oxynitride, silicon carbide, magnesium oxide, titanium oxide, tin oxide, indium oxide, zinc oxide or zirconium oxide, or a metal nitride or carbide or mixture thereof.

The inorganic oxide vapor-deposited film layer of the invention is a layer wherein the presence of Al—C covalent bonds is indicated by a peak as measured by ion etching in the depthwise direction using an X-ray photoelectron spectrometer (measuring conditions: X-ray source: AlKα, X-ray output: 120 W), and having transparency as well as a gas barrier property to prevent permeation of oxygen, water vapor and the like.

Furthermore, in the inorganic oxide vapor-deposited film layer of the invention, the abundance of Al—C covalent bonds among all of the bonds that include C based on measurement by X-ray photoelectron spectroscopy is preferably between 0.3% and 30%, in terms of reinforced adhesiveness between the inorganic oxide vapor-deposited film and the plastic substrate, excellent transparency, and well-balanced performance as a vapor-deposited film with a gas barrier property.

If the abundance ratio of Al—C covalent bonds is less than 0.3%, improvement in the adhesiveness of the formed inorganic oxide vapor-deposited film will be insufficient and it will be difficult to stably maintain the barrier property, while if it is greater than 30%, the problems of surface treatment, such as loss of improvement in the adhesiveness and reduction in transparency due to decomposition of the surface of the plastic substrate by the plasma processing, surface roughening and adhesion of decomposition components, will be greater than the improvement in adhesiveness by the plasma preprocessing, thereby reducing the effect of the preprocessing.

Also, the Al/O ratio of the inorganic oxide vapor-deposited film that is composed mainly of aluminum oxide is preferably no greater than 1.0 from the interface between the plastic substrate and vapor-deposited film up to 3 nm toward the vapor-deposited film surface.

If the Al/O ratio exceeds 1.0 from the interface between the inorganic oxide vapor-deposited film and plastic substrate toward the vapor-deposited film surface, the adhesiveness between the plasma-treated surface of the plastic substrate and the aluminum oxide vapor-deposited film will be insufficient, the proportion of aluminum will increase, and the transparency of the inorganic oxide vapor-deposited film will be reduced.

The thickness of a vapor deposited inorganic oxide film formed by a single film forming device is preferably 10 to 200 nm and more preferably 10 to 50 nm.

In the film-forming chamber 12C there is provided a vapor-deposited film forming device comprising a film-forming roller 25 and vapor-deposited film-forming means 24. The film-forming means of the vapor-deposited film forming device forms a vapor-deposited film on the plasma preprocessing surface of the plastic substrate that has been preprocessed by the plasma preprocessing means.

The vapor-deposited film forming device of the invention is disposed so as to form a vapor-deposited film on the plasma-preprocessed plastic substrate surface, and the method of vapor deposition for film formation of the vapor-deposited film may be any of various vapor deposition methods such as physical vapor deposition or chemical vapor deposition.

The physical vapor deposition method may be selected from the group consisting of vapor deposition, sputtering, ion plating, ion beam assist and cluster ion beam methods, or it may be selected from the group consisting of plasma CVD, plasma polymerization, thermal CVD and catalyst reactive CVD methods.

The film forming device comprises a film-forming roller that is set in a reduced pressure film-forming chamber and takes up and conveys a substrate that has been preprocessed with a plasma preprocessing device, with the processed side of the substrate facing outward, and performs film-forming processing, and also comprises vapor-deposited film-forming means such as a vapor-deposited film forming device, sputtering film forming device, ion plating film forming device, ion beam assist film forming device, cluster ion beam film forming device, plasma CVD film forming device, plasma polymerization film forming device, thermal CVD film forming device or catalyst reactive CVD film forming device, that vaporizes a film formation source target set opposite the film-forming roller to form a vapor-deposited film on the substrate surface.

The film forming device of the invention may employ various physical vapor deposition apparatuses by exchanging the vaporizing means for the film formation source target, or it may also have a construction allowing film formation by a chemical vapor deposition apparatus, and various film-forming methods may be used.

The vapor-deposited film-forming means 24 used may be a physical vapor deposition apparatus such as a resistance heating vacuum film forming device, sputtering apparatus, ion plating film forming device, ion beam assist film forming device, cluster ion beam film forming device or the like, or a chemical vapor deposition apparatus such as a plasma CVD film forming device, plasma polymerization film forming device, thermal CVD film forming device or catalyst reactive CVD film forming device, for formation of an inorganic oxide layer.

When a vacuum film forming device is used as the vapor-deposited film-forming means 24 of the invention, it may be one having a target metal material composed mainly of aluminum filled into a crucible as the vaporization source, either as a single type or different types, and heated to high temperature to generate aluminum metal-containing metal vapor, the metal vapor being oxidized by introduction of oxygen gas supplied from gas supply means to the aluminum metal vapor, to form a film of a metal oxide containing an aluminum oxide on the substrate surface.

When resistance heating is employed, a metal wire such as aluminum may be used for oxidation of the aluminum metal vapor in the same manner while forming a film on the substrate surface. The vaporization source for film formation may be a sputter vaporization source, arc vaporization source or a plasma CVD film formation mechanism such as a plasma generation electrode or source gas-supplying means.

During the film formation, depending on the composition of the vapor-deposited film to be formed, the metal material of the target may be separately vaporized so that aluminum oxide is the major component, according to the ease of vaporization of the aluminum and the other metal, or a mixture of the metal material for the desired proportion may be vaporized.

The film-forming means may be a single film forming device, or two or more of the same or different film forming devices in combination, depending on the vapor-deposited film to be formed in the film-forming chamber.

When a thin-film is to be formed to a high thickness with a single film forming device, the thin-film becomes fragile due to stress and cracking is generated, notably lowering the gas barrier property or causing detachment of the thin-film during conveyance or during take-up. A plurality of film forming devices may therefore be provided to obtain a thick layer of the gas barrier thin-film, for multiple formation of thin-films of the same substance.

Furthermore, the invention forms a coating film with moist heat resistance and a gas barrier property on the vapor-deposited film formed having reinforced adhesiveness, using a known roller-type coating applicator provided in a continuous manner (not shown). A plurality of film forming devices may be used to form thin-films of different materials, in which case it is possible to obtain a multilayer, multifunctional film imparted with not only a gas barrier property but also various other functions.

A plurality of film forming devices may be used to form thin-films of different materials, in which case it is possible to obtain a multilayer film imparted with not only a gas barrier property but also various other functions.

In a vapor-deposited film forming device it is particularly preferred for the preset temperature to be set to a constant temperature of between −20° C. and 100° C., from the viewpoint of heat resistance restrictions on the related mechanical parts and for general purpose use.

In various film forming methods, the film-forming pressure of the film-forming chamber in which vapor-deposited film formation is continuously carried out is preferably set and maintained at about 0.1 Pa to 100 Pa in order to form a vapor-deposited film having sufficient denseness of the vapor-deposited film and adhesiveness with the substrate.

(Coating Film Layer with Moist Heat Resistance and Gas Barrier Property)

The coating film layer with moist heat resistance and a gas barrier property will now be described.

The coating film layer is a coating film that retains its gas barrier property in high temperature, high humidity environments, and it contains at least one type of metal alkoxide represented by the general formula $R^1{}_{nM}(OR^2)_m$ (where $R^1$ and $R^2$ represent C1-8 organic groups, M represents a metal atom, n represents an integer of 0 or greater, m represents an integer of 1 or greater and n+m is the valence of M), and a water-soluble polymer, and it is also a coated film comprising a gas barrier composition obtained by polycondensation by a sol-gel method in the presence of a sol-gel method catalyst, an acid, water and an organic solvent.

The composition is applied onto the vapor-deposited film on the vapor-deposited film to form a coated film, and subjected to heat drying treatment for 10 seconds to 10 minutes at a temperature of 20° C. to 180° C., and no higher than the melting point of the vapor-deposited film.

The gas barrier composition may also be applied onto the vapor-deposited film on the base film and two or more coated films layered and subjected to heat drying treatment for 10 seconds to 10 minutes at 20° C. to 180° C. and no higher than the melting point of the base film, to form a compound polymer layer having two or more layered gas barrier coating films.

The metal atom represented by M in the general formula $R^1{}_{nM}(OR^2)_m$ for the metal alkoxide may be, for example, silicon, zirconium, titanium, aluminum or the like.

According to the invention, two or more of the aforementioned alkoxides may also be used together. For example, when a mixture of an alkoxysilane and a zirconium alkoxide is used, the toughness and heat resistance of the obtained gas barrier laminated film can be improved, and reduction in retort resistance of the film during stretching can be avoided. When an alkoxysilane and a titanium alkoxide are used in admixture, the thermal conductivity of the obtained gas barrier coating film is lowered and the heat resistance is notably increased.

The water-soluble polymer used for the invention may be a polyvinyl alcohol-based resin or an ethylene-vinyl alcohol copolymer, used alone, or a polyvinyl alcohol-based resin and an ethylene/vinyl alcohol copolymer may be used in combination. According to the invention, a polyvinyl alcohol-based resin and/or ethylene-vinyl alcohol copolymer may be used to notably improve the physical properties including the gas barrier property, water resistance and weather resistance.

As polyvinyl alcohol-based resins there may generally be used those obtained by saponification of polyvinyl acetate. Polyvinyl alcohol-based resins are not particularly restricted, and may be partially saponified polyvinyl alcohol-based resins with several tens of percent of acetic acid group residues, or totally saponified polyvinyl alcohols without acetic acid group residues, or modified polyvinyl alcohol-based resins modified with OH groups.

The ethylene-vinyl alcohol copolymer used may be a saponification product of a copolymer of ethylene and vinyl acetate, i.e. one obtained by saponification of an ethylene-vinyl acetate random copolymer.

There are no particular restrictions for these, and they include, for example, partial saponification products having several tens of mol % of residual acetic acid groups, and complete saponification products having only a few mol % of residual acetic acid groups or having absolutely no residual acetic acid groups. However, from the viewpoint of the gas barrier property the saponification degree is preferably 80 mol % or greater, more preferably 90 mol % or greater and even more preferably 95 mol % or greater.

It is preferred to use one wherein the content of ethylene-derived repeating units in the ethylene-vinyl alcohol copolymer (hereunder also referred to as "ethylene content") is generally 0 to 50 mol % and preferably 20 to 45 mol %.

According to the invention, the gas barrier laminated film may be produced by the following method.

First, the metal alkoxide, silane coupling agent, water-soluble polymer, sol-gel method catalyst, acid, water and organic solvent are mixed to prepare a gas barrier composition.

Next, the gas barrier composition is coated onto the vapor-deposited film on the vapor-deposited film by a common method, and dried. The drying step further promotes polycondensation of the metal alkoxide, silane coupling agent and polyvinyl alcohol-based resin and/or ethylene-vinyl alcohol copolymer, forming a coated film. This coating procedure may be repeated on the first coated film to form several coating films composed of two or more layers.

Next, the base film on which the gas barrier composition has been coated is subjected to heat treatment for 10 seconds to 10 minutes at a temperature of 20° C. to 180° C. and no higher than the melting point of the vapor-deposited film, and preferably in the range of 50° C. to 160° C. This allows production of a barrier property film having one, two or more gas barrier coated films formed from the gas barrier composition on the vapor-deposited film.

The method for coating the gas barrier composition of the invention may be, for example, coating once or several times using coating means such as roll coating with a gravure roll coater, spray coating, spin coating, dipping, brushing, bar coating or applicator coating, allowing formation of a coated film with a dry film thickness of 0.01 to 30 µm and preferably 0.1 to 10 µm, and then heating and drying in an ordinary environment at a temperature of 50° C. to 300° C. and preferably 70° C. to 200° C., for 0.005 to 60 minutes and preferably 0.01 to 10 minutes, resulting in condensation to form a gas barrier coated film according to the invention.

(Heat-Sealable Innermost Layer)

According to the invention, a heat-sealable thermoplastic resin or the like can be layered as an innermost layer via an adhesive layer, or without using one, to impart heat sealability.

The heat seal layer used for this may be a resin layer or film or sheet that can melt and be fused together by heat, and for example, it may be a low-density polyethylene, medium-density polyethylene, high-density polyethylene or linear low-density resin film or sheet.

Also, it is preferred to use, for example, a sheet comprising one or more resins such as low-density polyethylene, medium-density polyethylene, high-density polyethylene, linear low-density polyethylene, polypropylene, polymethylpentene, polystyrene, ethylene-vinyl acetate copolymer, α-olefin copolymer, ionomer resin, ethylene-acrylic acid copolymer, ethylene-ethyl acrylate copolymer, ethylene-methyl methacrylate copolymer, ethylene-propylene copolymer, an elastomer or the like, or films thereof, among which there are more preferred sheets comprising one or more olefin-based resins such as polyethylene or polypropylene, or films thereof, which have excellent hygienic properties, heat resistance, chemical resistance and aroma retention, since the layer will be in contact with contents such as food.

Also, the thickness is preferably about 13 to 100 µm and more preferably about 15 to 70 µm.

The heat seal layer may also have a light-shielding property. According to the invention, a heat seal layer with a light-shielding property may be a material having a property of shielding external light.

Specifically, the material used for a light-shielding heat seal layer may be a vapor-deposited film formed by vacuum vapor deposition or sputtering of a metal such as aluminum on a heat sealable film.

A light-shielding property can also be imparted by using an opaque film as the film, or using a film having a light-shielding ink layer formed thereon.

It is preferred to form a metal vapor-deposited film of aluminum or the like in order to impart a light-shielding property and barrier property as a packaging material.

Specifically, the material for the barrier layer will usually be a vapor-deposited film formed by vacuum vapor deposition of a metal such as aluminum on a plastic film, but aluminum foil may be used instead.

The metal to be formed in the metal vapor-deposited film is preferably a metal such as aluminum (Al), chromium (Cr), silver (Ag), copper (Cu), tin (Sn) or the like, with aluminum (Al) being preferred for use.

An aluminum foil preferably has a thickness of about 5 to 30 µm, and a metal vapor-deposited film preferably has a thickness of about 50-3000 angstrom and more preferably 100-1000 angstrom.

Such a light-shielding ink may be, specifically, ink containing a pigment with a light-shielding property, such as aluminum paste.

The film thickness of the ink layer is preferably about 1 to 8 µm and more preferably about 2 to 5 µm.

A white film may be used, that contains a white pigment composed mainly of a polyolefin resin that imparts a light-shielding property.

The white pigment used in the white film may be, specifically, titanium oxide, zinc oxide, the extender pigment aluminum hydroxide, magnesium carbonate, calcium carbonate, settling barium sulfate, silica, talc or the like.

The white pigment content is preferably about 10% to 40%.

The method of forming the metal vapor-deposited film according to the invention will now be explained, where the method may be, for example, a physical vapor deposition method (PVD) such as vacuum vapor deposition, sputtering or ion plating, or a chemical vapor deposition method (CVD) such as plasma chemical vapor deposition, thermochemical vapor deposition or photochemical vapor deposition.

As an explanation of the method of forming the metal vapor-deposited film according to the invention, the vapor-deposited film may be formed using a vacuum vapor deposition method in which the aforementioned metal is used as starting material and heated for vapor deposition on a flexible film, an oxidation reaction vapor deposition method in which a metal is used as starting material and oxygen gas or the like is introduced for oxidation to cause vapor deposition on a flexible film, or a plasma-assisted oxidation reaction vapor deposition method in which the oxidation reaction is further assisted with plasma.

The following is an explanation of a method for producing a highly adhesive transparent vapor-deposited film by employing a continuous vapor-deposited film forming device having separately provided a preprocessing chamber with a plasma preprocessing device of the invention, and a film-forming chamber.

A roll-shaped substrate S supply roll is set on the wind-out roller 13 in a substrate conveying chamber 12A, and a vacuum pump is used to reduce the pressure in the substrate conveying chamber 12A and in the plasma preprocessing chamber and film-forming chamber 12C.

After the pressure has been reduced to the prescribed pressure, the substrate S is wound out from the substrate S supply roll by the wind-out roller 13, the substrate S is directed to the plasma preprocessing device via the guide roller 14a, and the substrate S is taken up onto the preprocessing roller 20 for plasma preprocessing, whereby the substrate S is transferred from the substrate conveying chamber 12A to the preprocessing chamber 12B.

Also, plasma is introduced between the plasma supply means and the preprocessing roller in a state that produces an applied potential, and plasma preprocessing is carried out so that the substrate S taken up on the preprocessing roller 20 has a plasma-preprocessed surface formed on one side by the plasma preprocessing means.

The substrate S with the plasma-preprocessed surface formed on one side is conveyed back to the substrate conveying chamber 12A by being wound around the guide roller 14b from the preprocessing roller 20.

It is then transferred from the guide rolls 14b, 14c into the substrate conveying chamber 12A, and taken up onto the film-forming roller 25 with the plasma-treated surface facing outward, thereby being conveyed into the film-forming chamber 12C. A vapor-deposited film is formed by vapor-deposited film-forming means 24 on the preprocessed surface of the substrate S in the film-forming chamber 12C.

The substrate S with the vapor-deposited film formed in this manner is conveyed back to the substrate conveying chamber 12A from the film-forming roller 25, and taken up as a roll by a take-up roller via the guide roller 14d.

According to an embodiment of the roller-type continuous vapor-deposited film forming device of the invention, the plastic substrate S prior to formation of the vapor-deposited film is passed through a gap formed by the preprocessing roller 20 and the plasma supply means and magnetism forming means 21, during which time plasma P is introduced from the plasma supply nozzles 22a, 22b, together with supply of plasma source gas, toward the substrate S in the gap near the outer periphery of the preprocessing roller 20, and a positive voltage is applied between the plasma P and the preprocessing roller 20 for plasma preprocessing, whereby the atmosphere in the plasma preprocessing means is improved.

Thus, a homogeneous and high-quality plasma-preprocessed surface is obtained on the plastic substrate, after which an inorganic oxide vapor-deposited film is formed by the vapor-deposited film-forming means 24 to obtain a substrate having a homogeneous vapor-deposited film with excellent adhesiveness.

It is also possible to obtain a plastic substrate with a homogeneous vapor-deposited film having adhesiveness even after hot water treatment at 121° C., 60 min and excellent water-resistant adhesiveness.

In addition, it is possible to obtain a substrate having a homogeneous vapor-deposited film with excellent moist heat-resistant adhesiveness, exhibiting adhesiveness even in a high temperature, high humidity environment, such as when stored for 500 hours in an environment of 60° C.×90% RH.

The substrate conveying chamber 12A has a different pressure than the plasma preprocessing chamber in which the electrode resides, by being partitioned with the partition 35a (zone seal). By forming spaces in the substrate conveying chamber 12A and preprocessing chamber 12B with different pressures, this eliminates plasma discharge of the preprocessing chamber 12B from becoming unstable due to leakage of the plasma P in the preprocessing chamber into the substrate conveying chamber 12A, or damage to the members of the substrate conveying chamber 12A, and electrical damage to the electrical circuits that serve to control the substrate conveying mechanism, which can lead to control failures, and as a result stable film formation and conveying of the substrate can be accomplished.

Specifically, the plasma processing pressure of the additional preprocessing chamber 12B is between 0.1 Pa and 100 Pa. By conducting preprocessing at such a preprocessing pressure it is possible to form stabilized plasma P.

The plasma preprocessing of the invention can prevent increase in impedance of plasma discharge, allowing easier formation of plasma P and allowing stabilized discharge and plasma processing for prolonged periods.

In addition, since the discharge impedance of the plasma P does not increase, it is possible to accomplish plasma processing with a greater processing speed, reduced film stress, and less damage to the substrate (minimized electrical charge-up, reduced substrate etching and reduced substrate coloration).

Thus, it is possible to optimize the discharge impedance, and to adjust the ion implantation effect onto the substrate and increase adhesiveness of the vapor-deposited film formed on the preprocessed surface, while reducing damage to the substrate and forming a satisfactory preprocessed surface.

The above explanation was set forth for a preferred embodiment of a highly adhesive transparent vapor-deposited film having Al—C covalent bonds at the interface between the plastic film and the inorganic oxide vapor-deposited film that is composed mainly of aluminum oxide, using a continuous vapor-deposited film forming device comprising a plasma preprocessing device according to the invention, with reference to accompanying drawings, but the invention is not limited to this example.

The invention may of course incorporate various modifications and alterations by a person skilled in the art within the scope of the technical concept disclosed in the present application, and these are naturally within the technical scope of the film forming device of the invention.

EXAMPLES

The invention will now be explained through examples and comparative examples.

A. Examples 1 to 4, Comparative Examples 1 to 3 and their Evaluation

Example 1

On the side of a 12 μm-thick PET (PET-F, product of Unitika, Ltd.) substrate to be provided with a vapor deposition layer, plasma was introduced using a continuous vapor-deposited film forming device having a separated preprocessing chamber provided with a plasma preprocessing device of the invention, and a film-forming chamber, from a plasma supply nozzle in the preprocessing chamber under the following plasma conditions, and after conducting plasma preprocessing at a transport speed of 480 m/min, an aluminum oxide vapor deposition layer was formed to a thickness of 8 nm on the plasma-treated surface under the following conditions being continuously transported in the film-forming chamber, using a reactive resistance heating system as the heating means of the vacuum vapor deposition method.

(Plasma Preprocessing Conditions)
High-frequency power source output: 4 kW
Plasma strength: 550 W·sec/m$^2$
Plasma-forming gas: Oxygen 100 (sccm), argon 1000 (sccm)
magnetism forming means: 1000 gauss permanent magnet
Applied voltage between preprocessing drum and plasma supply nozzles: 420 V
Degree of vacuum of preprocessing chamber: $2.0 \times 10^{-1}$ Pa
(Aluminum Oxide Film-Forming Conditions)
Degree of vacuum: $2.1 \times 10^{-2}$ Pa
Light transmittance at wavelength of 366 nm: 88%

Example 2

On the side of a 12 μm-thick PET (PET-F, product of Unitika, Ltd.) substrate to be provided with a vapor deposition layer, plasma was introduced from a plasma supply nozzle under the same conditions an Example 1, except that the plasma strength was 12 kW in the preprocessing chamber of the continuous vapor-deposited film forming device having a separated preprocessing chamber provided with a plasma preprocessing device of the invention, and a film-forming chamber, and after conducting plasma preprocessing at a transport speed of 480 m/min, an aluminum oxide vapor deposition layer was formed to a thickness of 8 nm on the plasma-treated surface under the same conditions as Example 1, being continuously transported in the film-forming chamber, using a reactive resistance heating system.

Example 3

On the side of a 12 μm-thick PET (PET-F, product of Unitika, Ltd.) substrate to be provided with a vapor deposition layer, plasma was introduced from a plasma supply nozzle under the same conditions an Example 1, except that the plasma strength was 12 kW in the preprocessing chamber of the continuous vapor-deposited film forming device having a separated preprocessing chamber, provided with a plasma preprocessing device of the invention, and a film-forming chamber, and the oxygen plasma-forming gas was changed to nitrogen, and after conducting plasma preprocessing at a transport speed of 480 m/min, an aluminum oxide vapor deposition layer was formed to a thickness of 8 nm on the plasma-treated surface under the same conditions as Example 1 while being continuously transported in the film-forming chamber, using a reactive resistance heating system.

Example 4

On the side of a 12 μm-thick PET (PET-F, product of Unitika, Ltd.) substrate to be provided with a vapor deposition layer, plasma was introduced from a plasma supply nozzle under the same conditions an Example 1, except that the plasma strength was 12 kW in the preprocessing chamber of the continuous vapor-deposited film forming device having a separated preprocessing chamber provided with a plasma preprocessing device of the invention, and a film-forming chamber, and after conducting plasma preprocessing at a transport speed of 480 m/min, an aluminum oxide vapor deposition layer was formed to a thickness of 8 nm on the plasma-treated surface under the following conditions, while being continuously transported in the film-forming chamber, using a reactive resistance heating system.
(Aluminum Oxide Film-Forming Conditions)
Degree of vacuum: $2.5 \times 10^{-2}$ Pa
Light transmittance at wavelength of 366 nm: 82%

Comparative Example 1

The side of a 12 μm-thick PET (PET-F, product of Unitika, Ltd.) substrate to be provided with a vapor deposition layer was subjected to plasma preprocessing at a transport speed of 480 m/min under the following plasma processing conditions using a continuous vapor-deposited film forming device equipped with a parallel flat plate-type direct current-type plasma generating device, and then an aluminum oxide vapor deposition layer was formed to a thickness of 8 nm on the plasma-treated surface under the conditions of Example 1 while being continuously transported, using a reactive resistance heating system.
(Plasma Preprocessing Conditions)
Plasma strength: 550 W·sec/m²
Plasma-forming gas: Oxygen 100 (sccm), argon 1000 (sccm)
Degree of vacuum of preprocessing chamber: $2.0 \times 10^{-1}$ Pa
(Aluminum Oxide Film-Forming Conditions)
Degree of vacuum: $2.1 \times 10^{-2}$ Pa
Light transmittance at wavelength of 366 nm: 88%

Comparative Example 2

The side of a 12 μm-thick PET (PET-F, product of Unitika, Ltd.) substrate to be provided with a vapor deposition layer was subjected to plasma preprocessing at a transport speed of 480 m/min under the same plasma processing conditions as Comparative Example 1 using a continuous vapor-deposited film forming device equipped with a parallel flat plate-type direct current-type plasma generating device, and then an aluminum oxide vapor deposition layer was formed to a thickness of 8 nm on the plasma-treated surface under the following conditions while being continuously transported, using a reactive resistance heating system.
(Aluminum Oxide Film-Forming Conditions)
Degree of vacuum: $2.2 \times 10^{-2}$ Pa
Light transmittance at 366 nm: 75%

Comparative Example 3

On the corona side of 12 μm-thick PET (PET-F, product of Unitika, Ltd.) there was formed an aluminum oxide vapor deposition layer to a thickness of 8 nm using a reactive resistance heating system, under the conditions of Example 1.
(Evaluation)
The vapor-deposited films produced under the conditions of Examples 1 to 4 and Comparative Examples 1 to 3, described in the examples and comparative examples, were used as samples for X-ray photoelectron spectroscopy, measurement of the oxygen permeability, measurement of the hydrogen permeability and measurement of the bonding strength between the films and vapor-deposited films.

The measuring samples were used for the following measurements, by X-ray photoelectron spectroscopy and measurement of the oxygen permeability, water vapor permeability and lamination strength (peel strength).
<Evaluation Methods>
1. X-Ray Photoelectron Spectroscopy An X-ray photoelectron spectrometer (Quantum 2000) by PHI was used for analysis of the bonded state at the interface between the vapor-deposited film, such as aluminum oxide, and the film substrate, such as a PET substrate, using AlKα (1486.6 eV) as the X-ray source, with an output of 120 W, and measurement was conducted for each of the bond types between the vapor-deposited film and film, including bonds of 283.5±0.5 eV (CIS bond energy) arising from carbon-aluminum bonding (Al—C covalent bonds).

Also, the Al/O ratio was calculated from the relative content ratio of Al and O, as obtained from the X-ray photoelectron spectroscope.
2. Gas Barrier Property (Oxygen/Water Vapor)
<Oxygen Permeability>

Using an oxygen permeability meter ([device name: OX-IRAN 2/21] by Modan Control (MOCON)), the test sample was set with the film side as the humidification side, and measurement was carried out according to JIS K 7126 B with the measuring conditions being an environment of 23° C., 100% RH.

<Measurement of Water Vapor Permeability>

Using a water vapor permeability meter ([device name: PERMATRAN 3/33] by Modan Control (MOCON)), the test sample was set with the barrier coat layer side as the humidification side, and measurement was carried out according to JIS K 7126 B with the measuring conditions being an environment of 37.8° C., 100% RH.

Bonding Strength Between Plastic Substrate and Aluminum Oxide Vapor Deposition Layer <Bonding Strength Measurement (1)>

The vapor deposition surface side of the vapor-deposited film was coated with a two-pack curable polyurethane-based adhesive and dried, and this was dry laminated with an unstretched polypropylene film with a thickness of 30 μm that had been coated with a two-pack curable polyurethane-based adhesive and dried, to form a layered composite film for use as a bonding strength measuring sample.

The layered composite film was subjected to aging treatment for 48 hours, and then with the sample cut into 15 mm-wide strips, a tensile tester (device name: TENSILON General-Purpose Material Tester by Orientech Co., Ltd.) was used according to JIS K6854-2 for measurement of the bonding strength at the bonding interface between the vapor-deposited film and the unstretched polypropylene film, by 180° peeling at a peel rate of 50 mm/min (T-peel method).

<Bonding Strength Measurement (2)>

The vapor deposition surface side of the vapor-deposited film was coated with a two-pack curable polyurethane-based adhesive and dried, and this was dry laminated with an unstretched polypropylene film with a thickness of 30 μm that had been coated with a two-pack curable polyurethane-based adhesive and dried, to form a layered composite film, and after completing aging, it was used as a bonding strength measuring sample.

The layered composite film was used to form a four-sided pouch prepared to size B5, 100 mL of water was poured in and hot water retort treatment was carried out at 121° C., 60 min, and after removing the water, a sample cut into 15 mm-wide strip from the four-sided pouch was used for measurement of the bonding strength at the bonding interface between the vapor-deposited film and the unstretched polypropylene film, with a tensile tester (device name: TENSILON General-Purpose Material Tester by Orientech Co., Ltd.) according to JIS K6854-2, by 180° peeling at a peel rate of 50 mm/min (T-peel method).

<Bonding Strength Measurement (3)>

The vapor deposition surface side of the vapor-deposited film was coated with a two-pack curable polyurethane-based adhesive and dried, and this was dry laminated with an unstretched polypropylene film with a thickness of 30 μm that had been coated with a two-pack curable polyurethane-based adhesive and dried, to form a layered composite film, and after completing aging, it was used as a bonding strength measuring sample.

A sheet prepared to size B5 using the layered composite film was stored for 500 hours in a thermo-hygrostat at 60° C., 90% RH, and then with the sample cut into 15 mm-wide strips, a tensile tester (device name: TENSILON General-Purpose Material Tester by Orientech Co., Ltd.) was used according to JIS K6854-2 for measurement of the bonding strength at the bonding interface between the vapor-deposited film and the unstretched polypropylene film, by 180° peeling at a peel rate of 50 mm/min (T-peel method).

<Measurement results for bonding strength measurement (1)>

The results for evaluation of the performance of testing samples for bonding strength measurement (1) are shown in Table 1.

TABLE 1

| Example | Al—C bond abundance ratio (%) | Al/O ratio up to 3 nm | Surface roughness Ra [nm] | Oxygen permeability [cc/m$^2$·day] | Water vapor permeability [g/m$^2$·day] | Bonding strength [N/15 mm] |
|---|---|---|---|---|---|---|
| Example 1 | 17 | 0.83 | 8 | 1.3 | 1.2 | 5.8 |
| Example 2 | 21 | 0.79 | 8 | 1.3 | 1.8 | 7.4 |
| Example 3 | 20 | 0.82 | 8 | 1.4 | 1.7 | 6.9 |
| Example 4 | 22 | 0.91 | 8 | 1.6 | 2.1 | 7.7 |
| Comp. Ex. 1 | Below detection limit | 0.85 | 12 | 1.4 | 1.5 | 2.5 |
| Comp. Ex. 2 | Below detection limit | 1.44 | 11 | 1.8 | 2.4 | 2.1 |
| Comp. Ex. 3 | Below detection limit | 0.87 | 8 | 1.8 | 2.6 | 2.7 |

As shown in Table 1, a clear difference was seen between the vapor-deposited films produced using the plasma preprocessing device of the invention, and those of the prior art.

In plasma preprocessing by a continuous vapor-deposited film forming device separately comprising a preprocessing chamber provided with a plasma preprocessing device of the invention, and a film-forming chamber, the surface roughness is Ra=8 nm, while the surface roughness is still Ra=8 nm on the plastic substrate without plasma preprocessing in Comparative Example 3, whereas with conventional plasma preprocessing, the surface roughness is large at Ra=11 to 13 nm, and with plasma RIE, the plasma etching is such that the surface is ion-etched to sputter off the impurities and produce a smooth surface (Ra=4 nm), causing the surface condition to be altered, and therefore the plasma preprocessing of the invention clearly differs in a technical sense from conventional plasma processing.

The surface roughness Ra is measured at 20 different locations in a visual field range of 0.11 mm×0.11 mm using a non-contact three-dimensional surface roughness meter (NewView TM7000 by Zygo), and the arithmetic mean roughness (Ra) is calculated from the average value.

Furthermore, it is notable that with the plasma preprocessing of the invention, the abundance ratio of Al—C covalent bonds was 17% to 22%, while being absent below the detection limit (not generated) by conventional plasma preprocessing, as shown in Table 1, and therefore Al—C covalent bonds were produced in a high proportion during vapor-deposited film formation.

As seen by the bonding strengths in the examples and comparative examples, the bonding strength was 5.8 to 7.7 by the plasma preprocessing of the invention, while the bonding strength was 2.1 to 2.7 by the conventional plasma preprocessing, and thus generation of Al—C covalent bonds can increase the adhesiveness by about 3-fold.

Moreover, the expression of such bonding strength is assumed to be due to the Al—C covalent bonds, allowing a vapor-deposited film to be obtained with stable bonding strength, unlike with layering of a plastic substrate and a vapor-deposited film by functional groups via oxygen as in the prior art.

A vapor-deposited film obtained by plasma preprocessing using a continuous vapor-deposited film forming device separately comprising a preprocessing chamber provided with a plasma preprocessing device of the invention, and a film-forming chamber, can be produced as a vapor-deposited film with low water vapor permeability and oxygen permeability and stable performance, as is clear by comparison between Examples 1 to 4 and Comparative Examples 1 to 3, and it has become possible to form a high-quality, homogeneous vapor-deposited film with significantly reinforced adhesiveness between the plastic substrate and the vapor-deposited film.

<Measurement Results for Lamination Strength Measurement (2)>

The results for evaluation of the performance of testing samples for lamination strength measurement (2) are shown in Table 2.

(not generated) by conventional plasma preprocessing, as shown in Table 2, and therefore Al—C covalent bonds were produced during vapor-deposited film formation. As seen by the bonding strengths in the examples and comparative examples, the bonding strength based on the lamination strength between the plastic film and the vapor deposition layer after hot water treatment at 121° C., 60 min was 4.0 to 4.8 with plasma preprocessing according to the invention, whereas the bonding strength based on measurement of the lamination strength with conventional plasma preprocessing was 0.1 to 0.4, and thus generation of Al—C covalent bonds can increase the water-resistant adhesive of the water-resistant adhesive transparent vapor-deposited film of the invention by about 10- to 40-fold or greater.

Moreover, the expression of such bonding strength is assumed to be due to the Al—C covalent bonds, allowing a vapor-deposited film to be obtained with stable water-resistant adhesiveness, unlike with layering of a plastic substrate and a vapor-deposited film by functional groups via oxygen as in the prior art.

A vapor-deposited film obtained by plasma preprocessing using a continuous vapor-deposited film forming device separately comprising a preprocessing chamber provided with a plasma preprocessing device of the invention, and a film-forming chamber, can be produced as a vapor-deposited film with low water vapor permeability and oxygen permeability and stable performance, as is clear by comparison between Examples 1 to 4 and Comparative Examples 1 to 3, and it has become possible to form a high-quality, homogeneous vapor-deposited film with maintained adhesiveness

TABLE 2

| Example | Al—C bond abundance ratio (%) | Al/O ratio up to 3 nm | Surface roughness Ra [nm] | Oxygen permeability [cc/m² · day] | Water vapor permeability [g/m² · day] | Bonding strength [N/15 mm] |
| --- | --- | --- | --- | --- | --- | --- |
| Example 1 | 17 | 0.83 | 8 | 1.3 | 1.2 | 4.0 |
| Example 2 | 21 | 0.79 | 8 | 1.3 | 1.8 | 4.6 |
| Example 3 | 20 | 0.82 | 8 | 1.4 | 1.7 | 4.3 |
| Example 4 | 22 | 0.91 | 8 | 1.6 | 2.1 | 4.8 |
| Comp. Ex. 1 | Below detection limit | 0.85 | 12 | 1.4 | 1.5 | 0.1 |
| Comp. Ex. 2 | Below detection limit | 1.44 | 11 | 1.8 | 2.4 | 0.2 |
| Comp. Ex. 3 | Below detection limit | 0.87 | 8 | 1.8 | 2.6 | 0.4 |

As shown in Table 2, a clear difference was seen between the vapor-deposited films produced using the plasma preprocessing device of the invention, and those obtained by prior art preprocessing technology, based on comparison between the examples and comparative examples.

It is notable that with the plasma preprocessing of the invention, the abundance ratio of Al—C covalent bonds was 17% to 22%, while being absent below the detection limit between the plastic substrate and the vapor-deposited film even after hot water treatment, and significantly reinforced water-resistant adhesiveness.

<Measurement Results for Bonding Strength Measurement (3)>

The results for evaluation of the performance of testing samples for bonding strength measurement (3) are shown in Table 3.

TABLE 3

| Example | Al—C bond abundance ratio [%] | Al/O ratio up to 3 nm | Surface roughness Ra [nm] | Oxygen permeability [cc/m² · day] | Water vapor permeability [g/m² · day] | Bonding strength [N/15 mm] |
| --- | --- | --- | --- | --- | --- | --- |
| Example 1 | 17 | 0.83 | 8 | 1.3 | 1.2 | 3.3 |
| Example 2 | 21 | 0.79 | 8 | 1.3 | 1.8 | 3.7 |
| Example 3 | 20 | 0.82 | 8 | 1.4 | 1.7 | 3.5 |
| Example 4 | 22 | 0.91 | 8 | 1.6 | 2.1 | 3.9 |
| Comp. Ex. 1 | Below detection limit | 0.85 | 12 | 1.4 | 1.5 | ≤0.1 |
| Comp. Ex. 2 | Below detection limit | 1.44 | 11 | 1.8 | 2.4 | ≤0.1 |
| Comp. Ex. 3 | Below detection limit | 0.87 | 8 | 1.8 | 2.6 | ≤0.1 |

As shown in Table 3, a clear difference was seen between the vapor-deposited films produced using the plasma preprocessing device of the invention, and those obtained by prior art technology, based on comparison between the examples and comparative examples.

It is notable that with the plasma preprocessing of the invention, the abundance ratio of Al—C covalent bonds was 17% to 22%, while being absent below the detection limit (i.e. not generated) by conventional plasma preprocessing, as shown in Table 3, and therefore Al—C covalent bonds were produced at a high proportion during vapor-deposited film formation.

As seen by the bonding strengths in the examples and comparative examples, the bonding strength based on the lamination strength after storage for 500 hours at 60° C.×90% RH was 3.3 to 3.9 with plasma preprocessing according to the invention, whereas the bonding strength based on the lamination strength with conventional plasma preprocessing was 0.1 or lower, and thus generation of Al—C covalent bonds can increase the moist heat-resistant adhesiveness of the moist heat-resistant transparent vapor-deposited film of the invention by about 35-fold or greater compared to the prior art, even under high temperature, high humidity environments, without reduction in the gas barrier property.

Moreover, the expression of such bonding strength is assumed to be due to the Al—C covalent bonds, allowing a vapor-deposited film to be obtained with stable moist heat-resistant adhesiveness, unlike with layering of a plastic substrate and a vapor-deposited film by functional groups via oxygen as in the prior art.

A vapor-deposited film obtained by plasma preprocessing using a continuous vapor-deposited film forming device separately comprising a preprocessing chamber provided with a plasma preprocessing device of the invention, and a film-forming chamber, can be produced as a vapor-deposited film that maintains water vapor permeability and oxygen permeability and exhibits stable performance, as is clear by comparison between Examples 1 to 4 and the comparative examples, and it has become possible to form a high-quality, homogeneous vapor-deposited film with maintained adhesiveness between the plastic substrate and the vapor-deposited film even in high temperature, high humidity environments, and significantly reinforced moist heat-resistant adhesiveness.

B. Examples 5 to 9, Comparative Examples 4 to 7 and their Evaluation

Example 5

On the side of a 12 μm-thick PET (PET-F, product of Unitika, Ltd.) substrate to be provided with a vapor deposition layer, plasma was introduced using a continuous vapor-deposited film forming device having a separated preprocessing chamber provided with a plasma preprocessing device of the invention, and a film-forming chamber, from a plasma supply nozzle in the preprocessing chamber under the following plasma conditions, and after conducting plasma preprocessing at a transport speed of 480 m/min, an aluminum oxide vapor deposition layer was formed to a thickness of 8 nm on the plasma-treated surface under the following conditions in the continuously transporting film-forming chamber, using a reactive resistance heating system as the heating means of the vacuum vapor deposition method.

(Plasma Preprocessing Conditions)
High-frequency power source output: 4 kW
Plasma strength: 550 W·sec/m²
Plasma-forming gas: Oxygen 100 (sccm), argon 1000 (sccm)
magnetism forming means: 1000 gauss permanent magnet
Applied voltage between preprocessing drum and plasma supply nozzles: 420 V
Degree of vacuum of preprocessing chamber: $2.0 \times 10^{-1}$ Pa
(Aluminum Oxide Film-Forming Conditions)
Degree of vacuum: $2.1 \times 10^{-2}$ Pa
Light transmittance at wavelength of 366 nm: 88%

Example 6

A 0.3 μm gas barrier coating film was formed on the aluminum oxide vapor deposition layer of a film having an aluminum oxide vapor deposition layer, by the same method as in Example 5, to produce an adhesiveness-reinforced transparent vapor-deposited film.

Here, the gas barrier coating film was a gas barrier coating film of a gas barrier composition, obtained by first obtaining a colorless transparent gas barrier coating film-forming composition by adding a prepared hydrolysate with a solid content of 4 wt %, comprising tetraethoxysilane (ethyl silicate 40), hydrochloric acid, isopropyl alcohol, acetylacetone aluminum and ion-exchanged water to an EVOH solution comprising EVOH (ethylene copolymerization ratio: 29%) and a mixed solvent of isopropyl alcohol and ion-exchanged water, stirring the mixture and further adding a prepared liquid mixture comprising a polyvinyl alcohol aqueous solution, acetic acid, isopropyl alcohol and ion-exchanged water and stirring the mixture, and then coating this gas barrier coating film-forming composition onto an aluminum oxide vapor deposition layer by gravure roll coating and subsequently subjecting the composition to polycondensation by a sol-gel method with heating at 150° C. for 60 seconds.

Example 7

On the side of a 12 μm-thick PET (PET-F, product of Unitika, Ltd.) substrate to be provided with a vapor deposition layer, plasma was introduced from a plasma supply nozzle under the same conditions an Example 5, except that the plasma strength was 12 kW in the preprocessing chamber of the continuous vapor-deposited film forming device having a separated preprocessing chamber provided with a plasma preprocessing device of the invention, and a film-forming chamber, and after conducting plasma preprocessing at a transport speed of 480 m/min, an aluminum oxide vapor deposition layer was formed to a thickness of 8 nm on the plasma-treated surface under the same conditions as Example 5 in the continuously transporting film-forming chamber, using a reactive resistance heating system.

Next, the same procedure was carried out as in Example 5 to form a 0.3 μm gas barrier coating film on the aluminum oxide vapor deposition layer, to produce an adhesiveness-reinforced transparent vapor-deposited film.

Example 8

On the side of a 12 μm-thick PET (PET-F, product of Unitika, Ltd.) substrate to be provided with a vapor deposition layer, plasma was introduced from a plasma supply nozzle under the same conditions an Example 5, except that the plasma strength was 12 kW in the preprocessing chamber of the continuous vapor-deposited film forming device having a separated preprocessing chamber provided with a plasma preprocessing device of the invention, and a film-forming chamber, and the oxygen plasma-forming gas was changed to nitrogen, and after conducting plasma preprocessing at a transport speed of 480 m/min, an aluminum oxide vapor deposition layer was formed to a thickness of 8 nm on the plasma-treated surface under the same conditions as Example 5 in the continuously transporting film-forming chamber, using a reactive resistance heating system.

Next, the same procedure was carried out as in Example 5 to form a 0.3 μm gas barrier coating film on the aluminum oxide vapor deposition layer, to produce an adhesiveness-reinforced transparent vapor-deposited film.

Example 9

On the side of a 12 μm-thick PET (PET-F, product of Unitika, Ltd.) substrate to be provided with a vapor deposition layer, plasma was introduced from a plasma supply nozzle under the same conditions an Example 5, except that the plasma strength was 12 kW in the preprocessing chamber of the continuous vapor-deposited film forming device having a separated preprocessing chamber provided with a plasma preprocessing device of the invention, and a film-forming chamber, and after conducting plasma preprocessing at a transport speed of 480 m/min, an aluminum oxide vapor deposition layer was formed to a thickness of 8 nm on the plasma-treated surface under the following conditions in the continuously transporting film-forming chamber, using a reactive resistance heating system.

(Aluminum Oxide Film-Forming Conditions)
Degree of vacuum: $2.5 \times 10^{-2}$ Pa
Light transmittance at wavelength of 366 nm: 82%

Next, the same procedure was carried out as in Example 5 to form a 0.3 μm gas barrier coating film on the aluminum oxide vapor deposition layer, to produce an adhesiveness-reinforced transparent vapor-deposited film.

Comparative Example 4

The side of a 12 μm-thick PET (PET-F, product of Unitika, Ltd.) substrate to be provided with a vapor deposition layer was subjected to plasma preprocessing at a transport speed of 480 m/min under the following plasma processing conditions using a continuous vapor-deposited film forming device equipped with a parallel flat plate-type direct current-type plasma generating device, and then an aluminum oxide vapor deposition layer was formed to a thickness of 8 nm on the plasma-processed surface under the conditions of Example 5 while being continuously transported, using a reactive resistance heating system.

(Plasma Preprocessing Conditions)
Plasma strength: 550 W·sec/m²
Plasma-forming gas: Oxygen 100 (sccm), argon 1000 (sccm)
Degree of vacuum of preprocessing chamber: $2.0 \times 10^{-1}$ Pa
(Aluminum Oxide Film-Forming Conditions)
Degree of vacuum: $2.1 \times 10^{-2}$ Pa
Light transmittance at wavelength of 366 nm: 88%

Comparative Example 5

A 0.3 μm gas barrier coating film was formed on the aluminum oxide vapor deposition layer of a film having an aluminum oxide vapor deposition layer, by the same method as in Comparative Example 4, to produce an adhesiveness-reinforced transparent vapor-deposited film.

Comparative Example 6

The side of a 12 μm-thick PET (PET-F, product of Unitika, Ltd.) substrate to be provided with a vapor deposition layer was subjected to plasma preprocessing at a transport speed of 480 m/min under the same plasma processing conditions as Comparative Example 4 using a continuous vapor-deposited film forming device equipped with a parallel flat plate-type direct current-type plasma generating device, and then an aluminum oxide vapor deposition layer was formed to a thickness of 8 nm on the plasma-treated surface under the following conditions while being continuously transported, using a reactive resistance heating system.

(Aluminum Oxide Film-Forming Conditions)
Degree of Vacuum: $2.2 \times 10^{-2}$ Pa
Light transmittance at 366 nm: 75%

Next, the same procedure was carried out as in Example 5 to form a 0.3 μm gas barrier coating film on the aluminum oxide vapor deposition layer, to produce an adhesiveness-reinforced transparent vapor-deposited film.

Comparative Example 7

On the corona side of 12 μm-thick PET (PET-F, product of Unitika, Ltd.) there was formed an aluminum oxide vapor deposition layer to a thickness of 8 nm using a reactive resistance heating system, under the conditions of Example 5.

Next, the same procedure was carried out as in Example 5 to form a 0.3 μm gas barrier coating film on the aluminum oxide vapor deposition layer, to produce an adhesiveness-reinforced transparent vapor-deposited film.

(Evaluation)

The vapor-deposited films produced under the conditions of Examples 5 to 9 and Comparative Examples 4 to 7, or the vapor-deposited films having the gas barrier coating films formed on the vapor-deposited films, were used as samples for X-ray photoelectron spectroscopy, measurement of the oxygen permeability, measurement of the hydrogen permeability and measurement of the bonding strength between the films and vapor-deposited films.

The measuring samples were used for measurement by X-ray photoelectron spectroscopy and measurement of the oxygen permeability, water vapor permeability and bonding strength.

<Evaluation Methods>

1. Measurement was performed in the same manner as Example 1 for X-ray photoelectron spectroscopy, and for the oxygen permeability and water vapor permeability as gas barrier properties.

2. Bonding strength between plastic substrate and aluminum oxide vapor deposition layer <Measurement of Bonding Strength (4)>

The coating film side, where the gas barrier coating film had been formed on the vapor deposited surface side of the vapor-deposited film, was coated with a two-pack curable polyurethane-based adhesive and dried, and this was dry laminated with an unstretched polypropylene film with a thickness of 60 μm that had been coated with a two-pack curable polyurethane-based adhesive and dried, to form a layered composite film, and after completing aging, it was used as a bonding strength measuring sample.

The layered composite film was used to prepare a size B5 four-sided pouch into which 100 mL of water was poured, and hot water retort treatment was carried out at 121° C. for 60 minutes. After retort treatment, and cutting out a sample into a 15 mm-wide strip from the four-sided pouch after removal of the water contents, a tensile tester (device name: TENSILON General-Purpose Material Tester by Orientech Co., Ltd.) was used according to JIS K6854-2 for measurement of the bonding strength at the bonding interface between the vapor-deposited film and the unstretched polypropylene film, by 180° peeling at a peel rate of 50 mm/min (T-peel method).

<Measurement of Bonding Strength (5)>

The coating film side, where the gas barrier coating film had been formed on the vapor deposition surface side of the vapor-deposited film, was coated with a two-pack curable polyurethane-based adhesive and dried, and this was dry laminated with an unstretched polypropylene film with a thickness of 30 μm that had been coated with a two-pack curable polyurethane-based adhesive and dried, to form a layered composite film, and after completing aging, it was used as a bonding strength measuring sample.

A sheet prepared to size B5 using the layered composite film was stored for 500 hours in a thermo-hygrostat at 60° C., 90% RH, and then with the sample cut into 15 mm-wide strips, a tensile tester (device name: TENSILON General-Purpose Material Tester by Orientech Co., Ltd.) was used according to JIS K6854-2 for measurement of the bonding strength at the bonding interface between the vapor-deposited film and the unstretched polypropylene film, by 180° peeling at a peel rate of 50 mm/min (T-peel method).

<Measurement Results for Bonding Strength Measurement (4)>

The results for evaluation of the performance of testing samples for measurement of the bonding strength (4) are shown in Table 4.

TABLE 4

| Example | Al—C bond abundance ratio [%] | Surface roughness Ra [nm] | Al/O ratio up to 3 nm | Oxygen permeability [cc/m² · day] | Water vapor permeability [g/m² · day] | Bonding strength [N/15 mm] |
|---|---|---|---|---|---|---|
| Example 6 | 17 | 8 | 0.83 | 0.2 | 0.6 | 5.2 |
| Example 7 | 21 | 8 | 0.79 | 0.2 | 0.6 | 6.0 |
| Example 8 | 20 | 8 | 0.82 | 0.2 | 0.5 | 6.1 |
| Example 9 | 22 | 8 | 0.91 | 0.3 | 0.3 | 6.3 |
| Comp. Ex. 5 | Below detection limit | 12 | 0.85 | 0.2 | 0.6 | 0.5 |
| Comp. Ex. 6 | Below detection limit | 11 | 1.44 | 0.2 | 0.7 | 1.3 |
| Comp. Ex. 7 | Below detection limit | 8 | 0.87 | 0.2 | 0.7 | 0.7 |

As shown in Table 4, a clear difference was seen between the vapor-deposited films produced using the plasma pre-processing device of the invention, and those obtained by prior art technology, based on comparison between the examples and comparative examples.

It is notable that with the plasma preprocessing of the invention, the abundance ratio of Al—C covalent bonds was 17% to 22%, while being absent below the detection limit (not generated) by conventional plasma preprocessing, as shown in Table 4, and therefore Al—C covalent bonds were produced at a high proportion during vapor-deposited film formation.

As seen by the bonding strengths in the examples and comparative examples, the bonding strength based on the lamination strength after hot water retort treatment at 121° C. for 60 minutes was 5.2 to 6.3 with plasma preprocessing according to the invention, whereas the bonding strength based on the lamination strength with conventional plasma preprocessing was 0.5 to 1.3, and thus generation of Al—C covalent bonds can increase the hot water-resistant adhesiveness of the transparent vapor-deposited film for retort of the invention by about 4 to 10-fold or greater compared to the prior art even with hot water retort treatment with high temperature water, exhibiting hot water resistance while maintaining excellent gas barrier properties.

The expression of such bonding strength is assumed to be due to the Al—C covalent bonds, allowing a vapor-deposited film to be obtained with stable hot water-resistant adhesiveness, unlike with layering of a plastic substrate and a vapor-deposited film by functional groups via oxygen as in the prior art.

A vapor-deposited film obtained by plasma preprocessing using a continuous vapor-deposited film forming device separately comprising a preprocessing chamber provided with a plasma preprocessing device of the invention, and a film-forming chamber, can be produced as a transparent vapor-deposited film for retort that maintains excellent water vapor permeability and oxygen permeability and exhibits stable performance, as is clear by comparison between Examples 1 to 4 and the comparative examples, and it has become possible to form a high-quality, homogeneous transparent vapor-deposited film for retort having adhesiveness maintained between the plastic substrate and the vapor-deposited film and having significantly reinforced hot water-resistant adhesiveness, even after hot water retort treatment at 121° C. for 60 minutes.

<Measurement Results for Bonding Strength Measurement (5)>

The results for evaluation of the performance of testing samples for measurement of the bonding strength (5) are shown in Table 5.

TABLE 5

| Example | Al—C bond abundance ratio [%] | Surface roughness Rz [nm] | Al/O ratio up to 3 nm | Oxygen permeability [cc/m² · day] | Water vapor permeability [g/m² · day] | Bonding strength [N/15 mm] |
|---|---|---|---|---|---|---|
| Example 5 | 17 | 8 | 0.83 | 1.3 | 1.2 | 3.3 |
| Example 6 | 21 | 8 | 0.79 | 0.2 | 0.6 | 6.0 |
| Example 7 | 20 | 8 | 0.82 | 0.2 | 0.5 | 5.8 |
| Example 8 | 22 | 8 | 0.91 | 0.3 | 0.3 | 6.3 |
| Example 9 | 22 | 8 | 0.91 | 0.3 | 0.3 | 6.3 |
| Comp. Ex. 4 | Below detection limit | 12 | 0.85 | 0.2 | 0.6 | 0.5 |
| Comp. Ex. 5 | Below detection limit | 11 | 1.44 | 0.2 | 0.7 | 1.3 |
| Comp. Ex. 6 | Below detection limit | 8 | 0.87 | 0.2 | 0.7 | 0.7 |
| Comp. Ex. 7 | Below detection limit | 8 | 0.87 | 0.2 | 0.7 | 0.7 |

<Evaluation of Performance for Holding Contents>

A packaging material of the invention was then used to produce a packaging, and in order to evaluate the performance when holding contents, the vapor deposition layer or gas barrier coating film sides of the transparent vapor-deposited films obtained in Examples 5 to 9 and Comparative Examples 4 to 7 were coated with a two-pack curable polyurethane-based adhesive, a 15 µm-thick biaxially stretched nylon film was attached thereto, a two-pack curable polyurethane-based adhesive was further coated on the nylon film side and a 70 µm-thick unstretched polypropylene film was attached thereto, after which it was aged, to obtain a gas barrier layered composite film.

The same layered composite film was used to fabricate a 15 cm×15 cm four-sided pouch as a packaging bag, and after filling the packaging bag with water, curry sauce or Chinese soup without allowing bubbles in, it was subjected to retort sterilization treatment at 121° C. for 30 minutes, the gas barrier property and bonding strength were measured, and the outer appearance was examined for the presence of any delamination. The results are shown in Table 6.

TABLE 6

| Example | Contents | Oxygen permeability [cc/m² · day] | Water vapor permeability [g/m² · day] | Bonding strength [N/15 mm] | Delamination |
|---|---|---|---|---|---|
| Example 5 | Water | 2.2 | 2.5 | 5.0 | No |
| | Curry sauce | 2.4 | 2.8 | 4.8 | No |
| | Chinese soup | 2.0 | 2.1 | 4.8 | No |

TABLE 6-continued

| Example | Contents | Oxygen permeability [cc/m$^2$ · day] | Water vapor permeability [g/m$^2$ · day] | Bonding strength [N/15 mm] | Delamination |
|---|---|---|---|---|---|
| Example 6 | Water | 0.2 | 0.7 | 6.1 | No |
| | Curry sauce | 0.2 | 0.8 | 5.8 | No |
| | Chinese soup | 0.2 | 0.7 | 5.9 | No |
| Example 7 | Water | 0.2 | 0.6 | 5.8 | No |
| | Curry sauce | 0.2 | 0.7 | 5.8 | No |
| | Chinese soup | 0.2 | 0.7 | 5.8 | No |
| Example 8 | Water | 0.2 | 0.6 | 6.1 | No |
| | Curry sauce | 0.2 | 0.8 | 6.0 | No |
| | Chinese soup | 0.2 | 0.7 | 6.0 | No |
| Example 9 | Water | 0.2 | 0.6 | 6.2 | No |
| | Curry sauce | 0.2 | 0.7 | 5.9 | No |
| | Chinese soup | 0.2 | 0.6 | 6.0 | No |
| Comp. Ex. 4 | Water | 3.5 | 4.8 | 0.3 | Yes (PET/AlOx) |
| | Curry sauce | 3.8 | 5.2 | 0.3 | Yes (PET/AlOx) |
| | Chinese soup | 3.6 | 4.9 | 0.3 | Yes (PET/AlOx) |
| Comp. Ex. 5 | Water | 0.2 | 1.3 | 0.2 | Yes (PET/AlOx) |
| | Curry sauce | 0.2 | 1.5 | <0.1 | Yes (PET/AlOx) |
| | Chinese soup | 0.2 | 1.3 | <0.1 | Yes (PET/AlOx) |
| Comp. Ex. 6 | Water | 0.2 | 1.2 | 0.2 | Yes (PET/AlOx) |
| | Curry sauce | 0.2 | 1.6 | <0.1 | Yes (PET/AlOx) |
| | Chinese soup | 0.2 | 1.4 | <0.1 | Yes (PET/AlOx) |
| Comp. Ex. 7 | Water | 0.2 | 1.4 | 0.2 | Yes (PET/AlOx) |
| | Curry sauce | 0.2 | 1.7 | <0.1 | Yes (PET/AlOx) |
| | Chinese soup | 0.2 | 1.5 | <0.1 | Yes (PET/AlOx) |

The vapor deposition layer or gas barrier coating film sides of the transparent vapor-deposited films obtained in Examples 5 to 9 and Comparative Examples 4 to 7 were coated with a two-pack curable polyurethane-based adhesive, a 30 μm-thick high-density polyethylene film was attached thereto, and it was aged to obtain a gas barrier layered composite film.

The same layered composite film was used to fabricate a 15 cm×15 cm four-sided pouch as a packaging bag, and after filling the packaging bag with a rinse-containing shampoo, it was stored for 3 months at 40° C., 90% RH, the gas barrier property and bonding strength were measured, and the outer appearance was examined for the presence of any delamination. The results are shown in Table 7.

TABLE 7

| Example | Oxygen permeability [cc/m$^2$ · day] | Water vapor permeability [g/m$^2$ · day] | Bonding strength [N/15 mm] | Delamination |
|---|---|---|---|---|
| Example 5 | 2.2 | 2.2 | 5.6 | No |
| Example 6 | 0.2 | 0.5 | 5.2 | No |
| Example 7 | 0.2 | 0.4 | 5.9 | No |
| Example 8 | 0.3 | 0.5 | 5.8 | No |
| Example 9 | 0.3 | 0.6 | 5.6 | No |
| Comp. Ex. 4 | 2.4 | 4.2 | 0.3 | Yes (PET/AlOx) |
| Comp. Ex. 5 | 0.2 | 0.6 | 0.4 | Yes (PET/AlOx) |
| Comp. Ex. 6 | 0.2 | 0.5 | 0.3 | Yes (PET/AlOx) |
| Comp. Ex. 7 | 0.2 | 0.5 | 0.3 | Yes (PET/AlOx) |

As explained above, the packaging material of the invention exhibits satisfactory performance even when holding contents.

INDUSTRIAL APPLICABILITY

The present invention allows plasma preprocessing to be carried out homogeneously in a wide range of conditions on a long substrate surface under reduced pressure, and allows formation of a vapor-deposited film having a highly active surface and containing Al—C covalent bonds, so that a highly adhesive transparent vapor-deposited film having a homogeneous vapor-deposited film with excellent adhesiveness can be formed at high speed even when applying physical vapor deposition or chemical vapor deposition as the film-forming means.

Therefore, it can be applied as a packaging material for foods, drugs or the like that require layering materials having vapor-deposited films with excellent barrier properties that can block permeation of oxygen gas, water vapor and the like, and excellent adhesiveness, for example, layering materials that can withstand the heating of retort treatment or heat treatment, and as a material in fields with extreme use environments, such as electrical and electronic part packages and protective sheets that require durability and barrier properties, or it can be applied in the production of such materials.

EXPLANATION OF SYMBOLS

1, S: Plastic substrates
2: Inorganic oxide vapor-deposited film
3: Gas barrier coating film
P: Plasma
10: Roller-type continuous vapor-deposited film forming device
12: Pressure reduction chamber
12A: Substrate conveying chamber
12B: Plasma preprocessing chamber
12C: Film-forming chamber
13: Take-up roller
14: Guide roller
15: Take-up roller
18: Source gas volatilizing and supply apparatus
19: Source gas-supply nozzle
20: preprocessing roller
21: Magnet
22: Plasma supply nozzle
25: Film-forming roller
26: vapor-deposited film-forming means
30: Vacuum pump
31: Power supply wiring
32: Power source
35a-35c: Partitions

The invention claimed is:

1. A transparent laminated film comprising (a) a plastic substrate and (b) an inorganic oxide vapor-deposited film composed mainly of aluminum oxide formed on the surface of the plastic substrate, wherein the interface between the plastic substrate and the inorganic oxide vapor-deposited film comprises Al—C covalent bonds in an amount of between 0.3% and 30% of the total bonds that include C.

2. The transparent laminated film according to claim 1, further comprising a gas barrier coating film on the surface of the vapor-deposited film, wherein a metal alkoxide hydrolyzable product and a water-soluble polymer mixed solution are coated onto the vapor-deposited film surface and heat-dried to produce the gas barrier coating film.

3. The transparent laminated film according to claim 1 or 2, wherein the bonding strength between the plastic substrate and the vapor-deposited film is at least 3.0 N/15 millimeters based on measurement of the lamination strength after storage of the transparent laminated film for 500 hours in an environment of 60° C.×90% RH.

4. The transparent laminated film according to claim 1 or 2, wherein the bonding strength between the plastic substrate and the vapor-deposited film is at least 3 N/15 mm based on measurement of the lamination strength after hot water treatment of the transparent laminated film at 121° C., 60 min.

5. The transparent laminated film according to claim 1 or 2, wherein the amount of Al—C bonds is measured by X-ray photoelectron spectroscopy under conditions of X-ray source: AlKα, X-ray output: 120 W, and wherein the Al/O ratio of the inorganic oxide vapor-deposited film, measured within 3 nm of the vapor-deposited film from the interface, is no greater than 1.0.

6. The transparent laminated film according to claim 1 or 2, wherein the transparent laminated film is formed by plasma preprocessing a surface of the plastic substrate in a voltage-applied state, and then continuously forming the inorganic oxide vapor-deposited film on the plasma preprocessed surface of the plastic substrate.

7. The transparent laminated film according to claim 6, wherein the plasma preprocessing is plasma preprocessing using a roller-type continuous vapor-deposited film forming device comprising a preprocessing chamber, in which the surface of a plastic substrate to be provided with a vapor-deposited film is subjected to plasma processing, and a film-forming chamber in which the vapor-deposited film is formed, which are provided in a continuous manner, the plasma preprocessing being constructed such that there are situated a preprocessing roller and plasma supply means and magnetism forming means facing the preprocessing roller, the supplied plasma source gas is introduced as plasma near the substrate surface, with a gap being formed that traps the plasma, and plasma processing is carried out while holding in a voltage-applied state between the plasma preprocessing roller and the plasma supply means.

8. The transparent laminated film according to claim 6, wherein the preprocessing by plasma is processing in which the surface of the plastic substrate on which the vapor-deposited film is to be provided is processing using a roller-type continuous vapor-deposited film forming device having a separated plasma preprocessing chamber and vapor-deposited film-forming chamber, under conditions with a plasma strength per unit area of 100-8000 W·sec/m².

9. The transparent laminated film according to claim 6, wherein the plasma source gas is argon alone, and/or a mixed gas with argon and one or more from among oxygen, nitrogen and carbon dioxide gas.

10. The transparent laminated film according to claim 9, wherein the preprocessing with plasma is carried out using a plasma source gas comprising a mixed gas of argon and one or more from among oxygen, nitrogen and carbon dioxide gas.

11. The transparent laminated film according to claim 1 or 2, wherein the means for forming the vapor-deposited film is physical vapor deposition.

12. The transparent laminated film according to claim 1 or 2, wherein the inorganic oxide composed mainly of aluminum oxide further comprises a nitride or carbide of aluminum oxide, or a mixture thereof.

13. The transparent laminated film according to claim 1 or 2, wherein the inorganic oxide is an inorganic oxide mixture of aluminum oxide with one or more selected from among silicon oxide, magnesium oxide, tin oxide and zinc oxide.

14. The transparent laminated film according to claim 1 or 2, wherein an aluminum oxide vapor deposition layer is formed to a thickness of 5-100 nm on at least one surface of the plastic substrate.

15. The transparent laminated film according to claim 1 or 2, further comprising a heat-sealable thermoplastic resin layered as an innermost layer via an adhesive layer.

16. The transparent laminated film according to claim 2, wherein after forming a printed layer on the gas barrier coating film, a heat-sealable thermoplastic resin is layered as an innermost layer via an adhesive layer.

17. The transparent laminated film according to claim 15, wherein the heat-sealable thermoplastic resin has a light-shielding property.

18. A packaging material comprising the transparent laminated film according to claim 15, wherein the packaging material is subjected to boiling or retort sterilization.

19. A packaging material comprising the transparent laminated film according to claim 15, wherein the packaging material packages a daily commodity selected from the group consisting of a shampoo, a rinse or rinse-in-shampoo, a cosmetic package, and liquid soup package.

* * * * *